US012713761B2

(12) United States Patent
Choi et al.

(10) Patent No.: US 12,713,761 B2
(45) Date of Patent: Aug. 18, 2026

(54) TANDEM ORGANIC LIGHT EMITTING DEVICE WITH INCREASED EMISSION EFFICIENCY AND DISPLAY APPARATUS INCLUDING THE SAME

(71) Applicant: Samsung Display Co., Ltd., Yongin-si (KR)

(72) Inventors: Jungho Choi, Yongin-si (KR); Pilgu Kang, Yongin-si (KR); Dong Chan Kim, Yongin-si (KR); Jiyoung Moon, Yongin-si (KR); Hakchoong Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 495 days.

(21) Appl. No.: 18/339,533

(22) Filed: Jun. 22, 2023

(65) Prior Publication Data

US 2024/0121975 A1 Apr. 11, 2024

(30) Foreign Application Priority Data

Sep. 26, 2022 (KR) ........................ 10-2022-0121747

(51) Int. Cl.
*H10K 50/13* (2023.01)
*H10K 50/15* (2023.01)
(Continued)

(52) U.S. Cl.
CPC ........... *H10K 50/13* (2023.02); *H10K 50/156* (2023.02); *H10K 59/38* (2023.02); *H10K 59/80518* (2023.02); *H10K 2101/30* (2023.02)

(58) Field of Classification Search
CPC ...... H10K 50/13; H10K 50/156; H10K 59/38; H10K 59/80518; H10K 2101/30; H10K 50/19; H10K 50/826; H10K 2102/331
See application file for complete search history.

(56) References Cited

U.S. PATENT DOCUMENTS 9,142,710 B2 9/2015 Seo et al.
10,658,593 B2 5/2020 Kim et al.
(Continued)

FOREIGN PATENT DOCUMENTS

KR 1020140087975 A 7/2014
KR 1020170062938 A 6/2017
(Continued)

OTHER PUBLICATIONS

Ningbo Inno Pharmchem Co.,Ltd. NPD: The Key to Efficient Hole Transport in Organic Electronics (https://www.nbinno.com/article/oled-materials/npd-key-to-efficient-hole-transport-organic-electronics-qi) (Year: 2007).*

(Continued)

*Primary Examiner* — Chad M Dicke
*Assistant Examiner* — Jeremy Daniel Watts
(74) *Attorney, Agent, or Firm* — CANTOR COLBURN LLP

(57) ABSTRACT

A light emitting device may include a first electrode, a first light emitting stack disposed on the first electrode, a charge generation layer disposed on the first light emitting stack, a second light emitting stack disposed on the charge generation layer, and a second electrode disposed on the second light emitting stack. Each of the first light emitting stack and the second light emitting stack includes a hole transport layer. A hole mobility of the charge generation layer is lower than a hole mobility of the hole transport layer.

18 Claims, 9 Drawing Sheets

(51) Int. Cl.

| | |
|---|---|
| ***H10K 59/38*** | (2023.01) |
| ***H10K 59/80*** | (2023.01) |
| ***H10K 101/30*** | (2023.01) |

(56) References Cited

U.S. PATENT DOCUMENTS

| | | | | |
|---|---|---|---|---|
| 10,950,812 | B2 | 3/2021 | Han et al. | |
| 11,251,391 | B2 * | 2/2022 | Kum | H10K 85/654 |
| 2009/0016397 | A1 * | 1/2009 | Terano | H01S 5/34333 372/45.011 |
| 2017/0155071 | A1 * | 6/2017 | Han | H10K 59/32 |
| 2017/0213875 | A1 * | 7/2017 | Bi | H10K 50/15 |
| 2019/0288212 | A1 | 9/2019 | Cho et al. | |
| 2020/0395416 | A1 * | 12/2020 | Bae | G02B 5/201 |

FOREIGN PATENT DOCUMENTS

| | | |
|---|---|---|
| KR | 10-2019-0108217 | 9/2019 |
| KR | 10-2020-0016536 | 2/2020 |
| KR | 1020200144181 A | 12/2020 |
| KR | 10-2022-0042071 | 4/2022 |
| KR | 10-2022-0060510 | 5/2022 |

OTHER PUBLICATIONS

Kroger P-type Doping of Organic Wide Band Gap Materials by Transition Metal Oxides: A case Study on Molybdenum Trioxide (https://www.sciencedirect.com/science/article/pii/S1566119909001104) (Year: 2009).*

* cited by examiner

TANDEM ORGANIC LIGHT EMITTING DEVICE WITH INCREASED EMISSION EFFICIENCY AND DISPLAY APPARATUS INCLUDING THE SAME

CROSS-REFERENCE TO RELATED APPLICATION(S)

This U.S. non-provisional patent application claims priority to and benefits of Korean Patent Application No. 10-2022-0121747 under 35 U.S.C. § 119, filed on Sep. 26, 2022 in the Korean Intellectual Property Office, the entire contents of which are incorporated herein by reference.

BACKGROUND

1. Technical Field

The disclosure relates to a light emitting device with improved emission efficiency and device lifetime, and a display apparatus including the light emitting device.

2. Description of the Related Art

An organic light emitting device is a self-emissive device that has a high response speed and is driven at a low voltage. Accordingly, a separate light source may be omitted in an organic light emitting display apparatus including the organic light emitting device, and thus the organic light emitting display apparatus has several advantages such as lightweight, slimness, excellent brightness, absence of viewing angle dependence, and so on.

The organic light emitting device is a display device that has a light emitting layer composed of an organic matter between an anode electrode and a cathode electrode. Holes provided from the anode electrode and electrons provided from the cathode electrode are combined with each other in the light emitting layer to form excitons, and light corresponding to energy between the holes and the electrons is generated from the excitons.

A tandem organic light emitting device may have a structure in which two or more stacks of hole transport layer/light emitting layer/electron transport layer are disposed between an anode electrode and a cathode electrode. A charge generation layer that assists generation and movement of charges may be present between the respective stacks.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting device with improved emission efficiency.

The disclosure also provides a display apparatus with improved display efficiency.

An embodiment provides a light emitting device that may include a first electrode, a first light emitting stack disposed on the first electrode, a charge generation layer disposed on the first light emitting stack, a second light emitting stack disposed on the charge generation layer, and a second electrode disposed on the second light emitting stack. Each of the first light emitting stack and the second light emitting stack may include a hole transport layer. A hole mobility of the charge generation layer may be lower than a hole mobility of the hole transport layer.

In an embodiment, a material included in the hole transport layer may be different from a material included in the charge generation layer.

The hole mobility of the charge generation layer may be in a range of about 50% to about 80% of the hole mobility of the hole transport layer.

In an embodiment, the charge generation layer may include an n-type charge generation layer doped with an n-dopant, and a p-type charge generation layer doped with a p-dopant. A hole mobility of the p-type charge generation layer may be lower than the hole mobility of the hole transport layer.

In an embodiment, the p-type charge generation layer may include a thickness in a range of about 10 Å to about 100 Å, and the hole transport layer may include a thickness in a range of about 100 Å to about 700 Å.

In an embodiment, the first light emitting stack may include a first hole transport layer, and the second light emitting stack may include a second hole transport layer.

The hole mobility of the charge generation layer may be lower than a hole mobility of the second hole transport layer.

The second hole transport layer may be disposed directly on the charge generation layer.

In an embodiment, the first light emitting stack may include a first light emitting layer disposed on the first hole transport layer, and the second light emitting stack may include a second light emitting layer disposed on the second hole transport layer.

The first light emitting layer may emit light having a first wavelength, and the first wavelength may be in a range of about 410 nm to about 480 nm.

The second light emitting layer may emit light having a first wavelength or a second wavelength. The first wavelength may be in a range of about 410 nm to about 480 nm. The second wavelength may be in a range of about 500 nm to about 600 nm.

In an embodiment, the charge generation layer may include an n-type charge generation layer disposed on the first light emitting stack, and a p-type charge generation layer disposed on the n-type charge generation layer. The second light emitting stack may include a second hole transport layer.

In an embodiment, a hole mobility of the p-type charge generation layer may be lower than a hole mobility of the second hole transport layer.

In an embodiment, the second hole transport layer may be disposed directly on the p-type charge generation layer.

In an embodiment, the p-type charge generation layer may include a highest occupied molecular orbital (HOMO) energy level that is equal to or lower than a HOMO energy level of the second hole transport layer.

In an embodiment, the HOMO energy level of each of the p-type charge generation layer and the second hole transport layer may be in a range of about −5.3 eV to about −5.1 eV.

In an embodiment, a display apparatus may include a base layer including a first pixel region emitting light having a first wavelength, a second pixel region emitting light having a second wavelength different from the first wavelength, and a third pixel region emitting light having a third wavelength different from the first wavelength and the second wavelength, a light emitting device, which overlaps the first to third pixel regions and is disposed on the base layer, and a light control layer which is disposed on the light emitting device and includes a first light control unit overlapping the first pixel region, a second light control unit overlapping the second pixel region, and a third light control unit overlapping the third pixel region. The light emitting device may include a first electrode, a first light emitting stack disposed on the first electrode, a charge generation layer disposed on the first light emitting stack, a second light emitting stack disposed on the charge generation layer, and a second electrode disposed on the second light emitting stack. Each of the first light emitting stack and the second light emitting stack may include a hole transport layer. A hole mobility of the charge generation layer may be lower than a hole mobility of the hole transport layer.

In an embodiment, the second light control unit may include a quantum dot that converts the light having the first wavelength into the light having the second wavelength, and the third light control unit may include a quantum dot that converts the light having the first wavelength or the light having the second wavelength into the light having the third wavelength.

In an embodiment, the display apparatus may further include a color filter layer disposed on the light control layer.

In an embodiment, the first electrode may be a reflective electrode, the second electrode may be a transflective electrode or a transmissive electrode, and the light having the first wavelength may be emitted in a direction from the first electrode to the second electrode.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
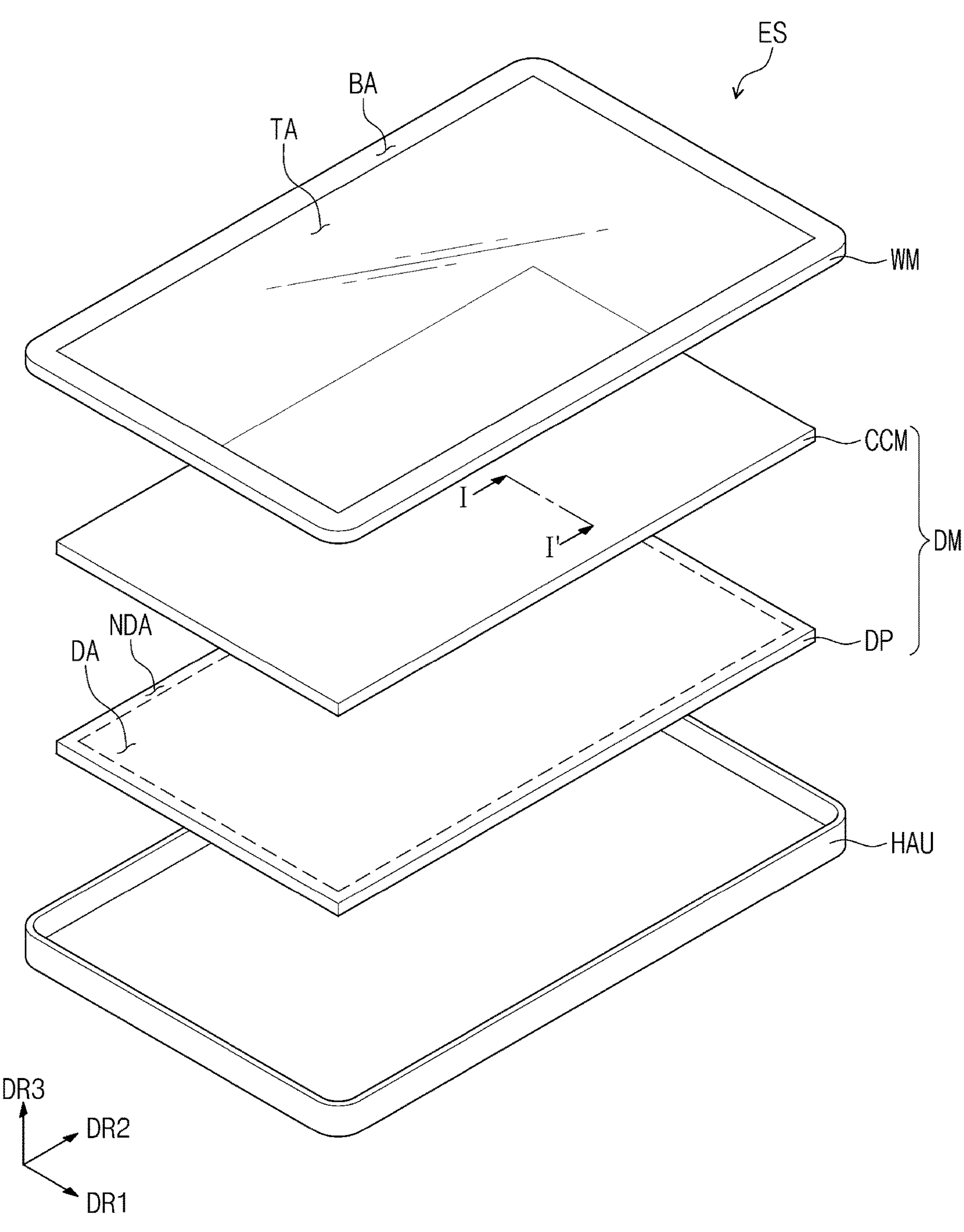
FIG. 1 is an exploded schematic perspective view of a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will be understood that when an element (or region, layer, section, etc.) is referred to as being "on", "connected to" or "coupled to" another element, it can be disposed directly on, connected or coupled to the other element or a third intervening elements may be disposed between the elements.

Like reference numbers or symbols refer to like elements throughout. In addition, in the drawings, the thickness, the ratio, and the dimension of elements may be exaggerated for effective description of the technical contents.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will be understood that, although the terms first, second, etc. may be used herein to describe various elements, these elements should not be limited by these terms. These terms are only used to distinguish one element from another element. For example, a first element could be termed a second element without departing from the teachings of the disclosure, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concept and are explained based on the direction shown in the drawing.

It will be further understood that the terms such as "includes" and "has", when used herein, specify the presence of stated features, numerals, steps, operations, elements, parts, or the combination thereof, but do not preclude the presence or addition of one or more other features, numerals, steps, operations, elements, parts, or the combination thereof.

It will also be understood that when a part such as a layer, film, region, or a plate, is referred to as being "on" or "above" another part, it can be directly on the other part, or an intervening layer may also be present. Similarly, when an element such as a layer, film, region, or a plate, is referred to as being "below" or "under" another part, it can be directly below the other element, or an intervening element may also be present.

The term "directly disposed" used herein may mean that there is no intervening element such as a layer, film, region, or a plate, between an element such as a layer, film, region, or a plate, and another element. For example, "being directly disposed" may mean that an additional member is not disposed between two layers or two members.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Figure 2:
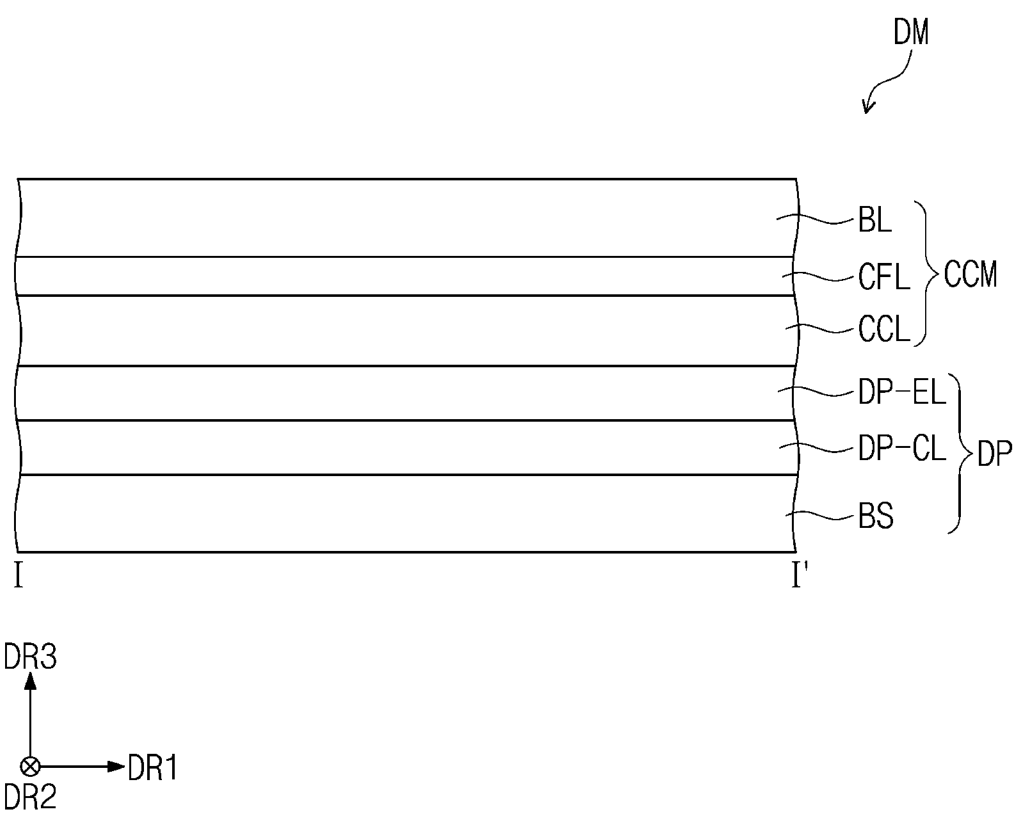
FIG. 2 is a schematic cross-sectional view of a display module according to an embodiment.

FIG. 1 is an exploded schematic perspective view of a display apparatus according to an embodiment. FIG. 2 is a schematic cross-sectional view of a display module according to an embodiment. FIG. 2 illustrates a cross-sectional view corresponding to line I-I' in FIG. 1.

In an embodiment, a display apparatus ES may be a large-sized display apparatus such as a television, a monitor, or an outdoor billboard. The display apparatus ES may be a small and medium-sized display apparatus such as a personal computer, a notebook computer, a personal digital assistant, a vehicle navigation unit, a game console, a smartphone, a tablet computer, and a camera. These are just provided as example embodiments, and another display apparatus may be employed.

The display apparatus ES according to an embodiment may include a window WM, a display module DM, and a housing HAU. The display module DM may include a display panel DP. Although not illustrated in the drawings, the display apparatus ES may include various devices, such as a touch device or a detection device, that are activated in response to an electrical signal, in addition to a display device.

In FIG. 1 and the following drawings, a first direction DR1 to a third direction DR3 are illustrated, and directions indicated by the first to third directions DR1, DR2 and DR3 used herein are relative concepts and may be changed to other directions.

For convenience of explanation, the third direction DR3 used herein may be defined as a direction in which an image is provided for a user. The first direction DR1 and the second direction DR2 may perpendicularly cross each other (intersect), and the third direction DR3 may be a normal direction to a plane defined by the first direction DR1 and the second direction DR2. In FIG. 1, the plane defined by the first direction DR1 and the second direction DR2 may be a display surface on which the image is provided.

In the display apparatus ES according to an embodiment, the window WM may be disposed on the display module DM. The window WM may be made of a material including glass, sapphire, and/or plastic. The window WM may include a transmission region TA through which the image provided from the display module DM transmits, and a light blocking region BA which is adjacent to the transmission region TA and through which the image may not be transmitted. Unlike that illustrated in FIG. 1, the window WM may be omitted in the display apparatus ES according to an embodiment.

In the display apparatus ES according to an embodiment, the display module DM may be disposed below the window WM. The display module DM may include the display panel DP and a light control member CCM disposed on the display panel DP.

The display panel DP may be an emissive display panel. For example, the display panel DP may be a light-emitting diode (LED) display panel, an organic electroluminescence display panel, or a quantum dot light emitting display panel. However, the disclosure is not limited thereto.

The LED display panel may include a light-emitting diode, a light emitting layer of the organic electroluminescence display panel may include an organic electroluminescent material, and a light emitting layer of the quantum dot light emitting display panel may include a quantum dot, a quantum rod, or the like. Hereinafter, the display panel DP included in the display apparatus ES according to an embodiment will be described as the organic electroluminescence display panel. However, the disclosure is not limited thereto.

The display apparatus ES according to an embodiment may include the display panel DP and the light control member CCM disposed above the display panel DP, and the display apparatus ES according to an embodiment may be an organic electroluminescence display apparatus including the organic electroluminescence display panel. The display panel DP may provide first light having a predetermined or selected wavelength. For example, the display panel DP may provide blue light as the first light. However, the disclosure is not limited thereto, and the display panel DP may emit white light.

The light control member CCM may convert the wavelength of the first light provided from the display panel DP or transmit the first light provided from the display panel DP. The light control member CCM may convert the wavelength of the first light provided from the display panel DP or transmit the first light.

A surface of the display panel DP on which an image is displayed may be defined as a display surface in a plan view. The display surface may include a display region DA, in which an image is displayed, and a non-display region NDA in which an image may not be displayed. The display region DA may be defined at a center of the display panel DP in a plan view to overlap the transmission region TA of the window WM.

The housing HAU may be disposed below the display panel DP to accommodate the display panel DP. The housing HAU may be disposed to cover the display panel DP so that an upper surface that is the display surface of the display panel DP is exposed. The housing HAU may cover a side surface and a bottom surface of the display panel DP and expose the entirety of the upper surface.

Referring to FIG. 2, the display panel DP may include a base substrate BS, and a circuit layer DP-CL and a display device layer DP-EL that are provided above the base layer BS. In an embodiment, the base substrate BS, the circuit layer DP-CL, and the display device layer DP-EL may be stacked on each other in sequence in the third direction DR3.

The base substrate BS may be a member that provides a base surface on which the display device layer DP-EL is disposed. The base substrate BS may be a glass substrate, a metal substrate, a polymer substrate, etc. However, the disclosure is not limited thereto, and the base substrate BS may be an inorganic layer, an organic layer, or a composite material layer.

In an embodiment, the circuit layer DP-CL may be disposed on the base substrate BS, and the circuit layer DP-CL may include transistors (not illustrated). The transistors (not illustrated) may each include a control electrode, an input electrode, and an output electrode. For example, the circuit layer DP-CL may include a switching transistor and a driving transistor for driving a light emitting device ED (see FIG. 4) of the display device layer DP-EL.

The light control member CCM may be disposed on the display panel DP. The light control member CCM may include a light control layer CCL, a color filter layer CFL, and an upper base layer BL. For example, the display panel DP may include the light emitting device ED (see FIG. 4) that emits light having a first wavelength and/or light having a second wavelength, and the light control member CCM may include the light control layer CCL (see FIG. 4) that converts the wavelength of the light provided by the light emitting device ED (see FIG. 4) or transmits the light.

Figure 3:
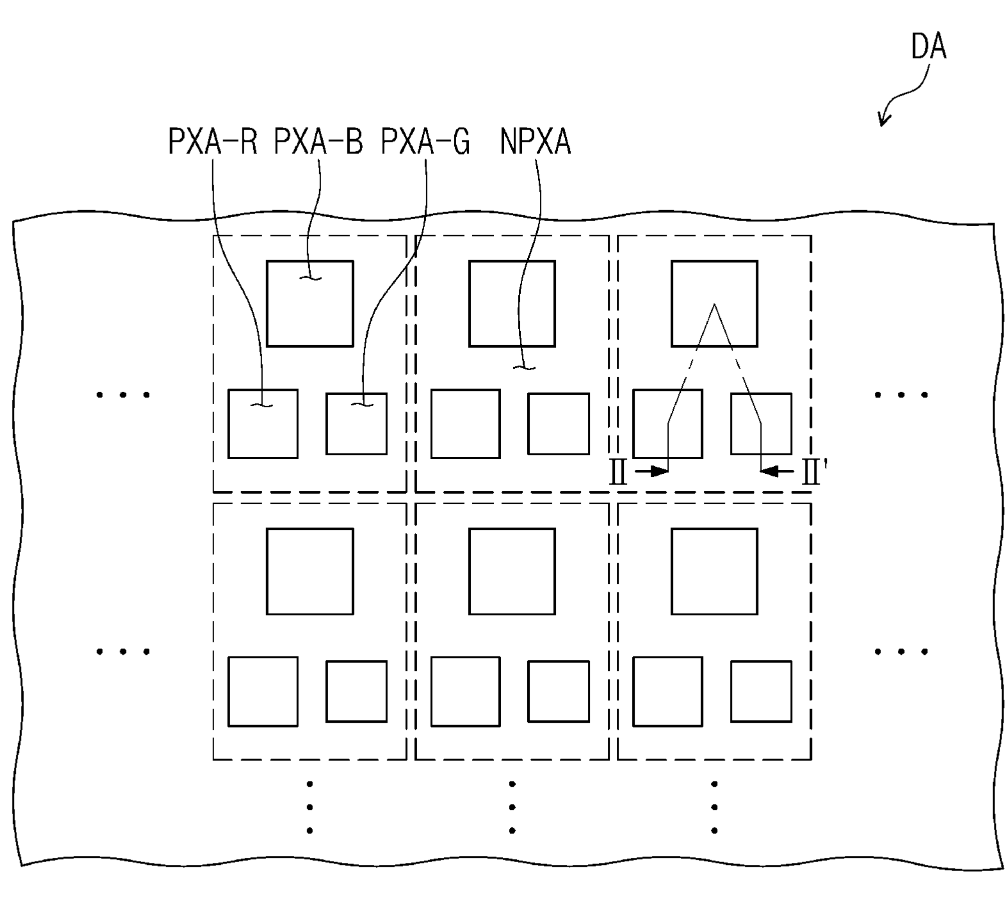
FIG. 3 is an exploded schematic plan view illustrating a portion of a display panel included in a display apparatus according to an embodiment.
Figure 3:
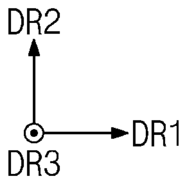
Figure 4:
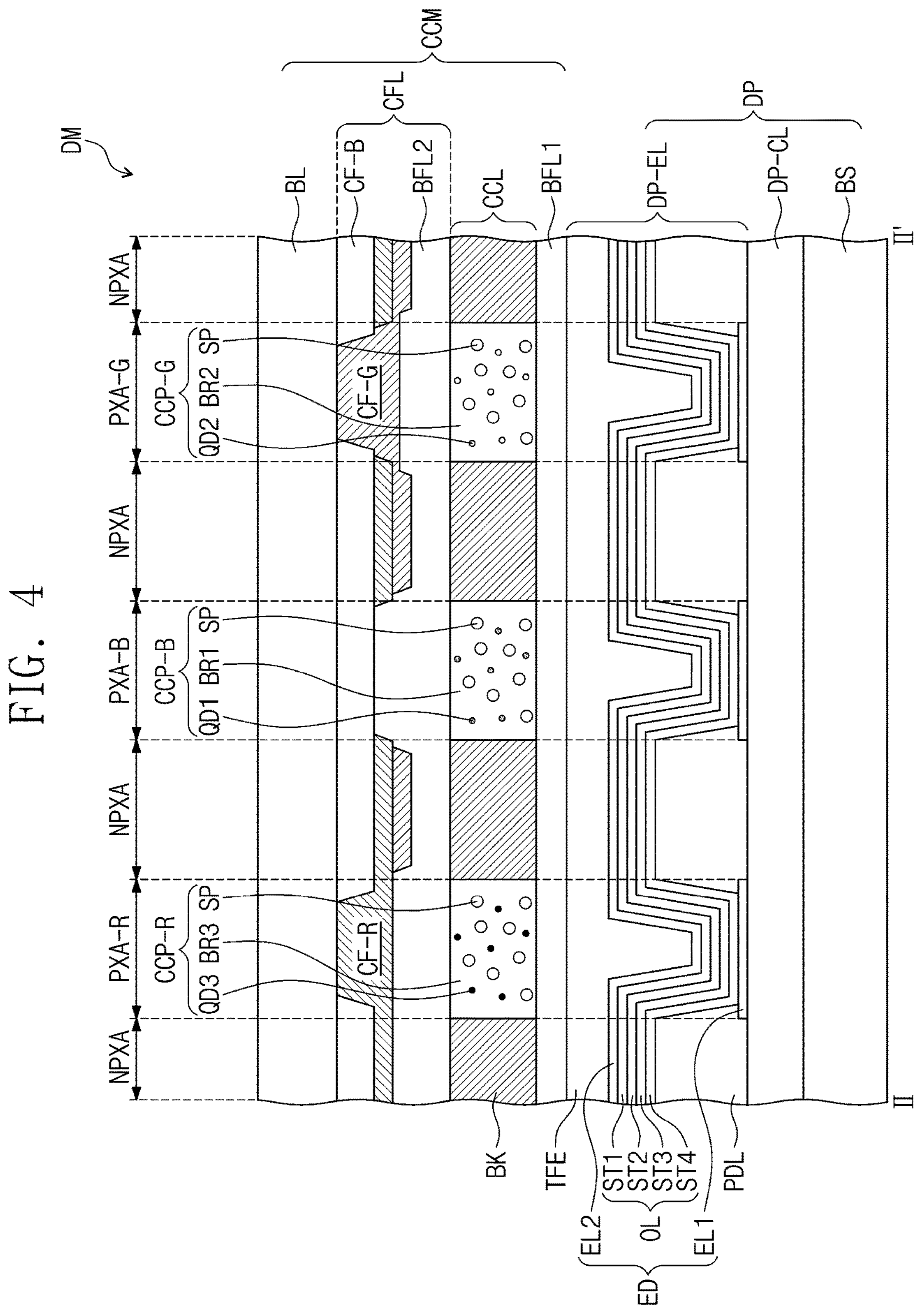
FIG. 4 is an exploded schematic cross-sectional view illustrating a portion of a display module included in a display apparatus according to an embodiment.

FIG. 3 is an exploded schematic plan view illustrating a portion of a display panel included in a display apparatus according to an embodiment. FIG. 4 is an exploded schematic cross-sectional view illustrating a portion of a display module included in a display apparatus according to an embodiment. FIG. 3 illustrates a portion of a display region DA of a display panel according to an embodiment. FIG. 4 illustrates a portion corresponding to line II-II' in FIG. 3.

A display module DM according to an embodiment described below with reference to FIGS. 3 and 4 may be included in the display apparatus ES according to an embodiment described with reference to FIG. 1, and the display module DM may include a display panel DP and a light control member CCM.

The display module DM according to an embodiment may include the display panel DP and the light control member CCM disposed on the display panel DP, and the light control member CCM may include a light control layer CCL and a color filter layer CFL. The light control member CCM may include an upper base layer BL, the light control layer CCL disposed below the upper base layer BL, and the color filter layer CFL disposed between the light control layer CCL and the upper base layer BL. In the light control member CCM, the light control layer CCL may be disposed adjacent to the display panel DP.

The light control member CCM may include partition walls or banks BK and light control units CCP-R, CCP-B and CCP-G disposed between the banks BK.

Referring to FIGS. 3 and 4, the display module DM may include non-pixel regions NPXA and pixel regions PXA-R, PXA-B and PXA-G. Each of the pixel regions PXA-R, PXA-B and PXA-G may be a region from which light generated in a light emitting device ED is emitted. The areas of the pixel regions PXA-R, PXA-B and PXA-G may be different from each other. Here, the areas may each mean an area when viewed in a plan view.

The pixel regions PXA-R, PXA-B and PXA-G may be divided into groups according to colors of emitted light. FIGS. 3 and 4 illustrate three pixel regions PXA-R, PXA-B and PXA-G that emit red light, blue light, and green light, respectively, in the display module DM according to an embodiment. For example, the display apparatus ES (see FIG. 1) according to an embodiment may include a red pixel region PXA-R, a blue pixel region PXA-B, and a green pixel region PXA-G that are distinguished from each other. The blue pixel region PXA-B may be a first pixel region and may emit light having an emission wavelength of about 410 nm to about 480 nm. The green pixel region PXA-G may be a second pixel region and may emit light having an emission wavelength of about 500 nm to about 600 nm. The red pixel region PXA-R may be a third pixel region and may emit light having an emission wavelength of about 620 nm to about 700 nm.

FIG. 4 illustrates that, in the display module DM according to an embodiment, the display panel DP includes the light emitting device ED including an organic layer OL as a common layer. For example, in the display module DM according to an embodiment illustrated in FIG. 4, the display panel DP may emit the same light regardless of the pixel regions PXA-R, PXA-B and PXA-G of the display module DM. For example, the display panel DP may provide the light control member CCM with the blue light that is first light. In another embodiment, the display panel DP may provide the light control member CCM with white light as the first light.

Among the pixel regions PXA-R, PXA-B and PXA-G in the display module DM according to an embodiment illustrated in FIGS. 3 and 4, the red pixel region PXA-R and the blue pixel region PXA-B may have the largest area, and the green pixel region PXA-G may have the smallest area. However, the disclosure is not limited thereto, and the pixel regions PXA-R, PXA-B and PXA-G may have the same area, or may have various areas according to the light emitted from the light control units CCP-R, CCP-B and CCP-G. For example, in the display module DM according to an embodiment, the green pixel region PXA-G may have the same area, and the blue pixel region PXA-B may have a smaller area than each of the red pixel region PXA-R and the green pixel region PXA-G. However, the disclosure is not limited thereto. The pixel regions PXA-R, PXA-B and PXA-G may emit light having different colors other than the red light, the blue light, and the green light, or the light emitting regions PXA-R, PXA-B and PXA-G may be provided in a different area ratio.

The pixel regions PXA-R, PXA-B and PXA-G may be regions divided by pixel defining films PDL, respectively. The non-pixel regions NPXA may be regions between neighboring pixel regions PXA-R, PXA-B and PXA-G, and may be regions corresponding to the pixel defining films PDL.

As illustrated in FIG. 3, among the pixel regions PXA-R, PXA-B and PXA-G, the red pixel region PXA-R and the green pixel region PXA-G may have a shape symmetrical around a reference axis extending in the second direction DR2, and the blue pixel region PXA-B may be disposed between the red pixel region PXA-R and the green pixel region PXA-G. When viewed in the first direction DR1, a portion of the blue pixel region PXA-B may not overlap each of the red pixel region PXA-R and the green pixel region PXA-G. However, the disclosure is not limited thereto, and the pixel regions PXA-R, PXA-B and PXA-G may have various polygonal shapes or a circular shape. An arrangement structure of the pixel regions is also not limited. For example, the pixel regions PXA-R, PXA-B and PXA-G may have a stripe structure in which the blue pixel region PXA-B, the green pixel region PXA-G, and the red pixel region PXA-R are arranged alternately in sequence. The pixel regions PXA-R, PXA-B and PXA-G may have a PENTILE® or a diamond arrangement structure.

Referring to FIG. 4, the display panel DP according to an embodiment may include a base substrate BS, a circuit layer DP-CL disposed on the base substrate BS, and a display device layer DP-EL disposed on the circuit layer DP-CL. The display device layer DP-EL may include the pixel defining films PDL, the light emitting device ED disposed between the pixel defining films PDL, and a thin film encapsulation layer TFE disposed on the light emitting device ED.

Each of the pixel defining films PDL may be made of a polymer resin. For example, the pixel defining film PDL may include a polyacrylate-based resin or a polyimide-based resin. The pixel defining film PDL may further include an inorganic matter in addition to the polymer resin. The pixel defining film PDL may include a light absorbing material, or may include a black pigment or a black dye. The pixel defining film PDL may be made of an inorganic matter. For example, the pixel defining film PDL may include a silicon nitride (SiNx), a silicon oxide (SiOx), a silicon oxynitride (SiOxNy), etc. The pixel defining film PDL may define the pixel regions PXA-R, PXA-B and PXA-G. The pixel regions PXA-R, PXA-B and PXA-G and the non-pixel regions NPXA may be divided by the pixel defining film PDL.

The pixel defining film PDL may overlap each of the banks BK. For example, each of multiple pixel defining films PDL may correspond to and overlap each of the banks BK.

The light emitting device ED may include a first electrode EL1 and a second electrode EL2, which face each other, and organic layers OL disposed between the first electrode EL1 and the second electrode EL2. The organic layers OL of the light emitting device ED may include stacks ST1, ST2, ST3 and ST4. Each of the stacks ST1, ST2, ST3 and ST4 may include functional layers including a hole transport material and an electron transport material, and a light emitting layer including a light emitting material. For example, the light emitting device ED included in the display module DM according to an embodiment may be a light emitting device having a tandem structure including multiple light emitting layers. Each of the functional layers and the light emitting layers included in the light emitting device ED will be described later.

FIG. 4 illustrates an embodiment in which each of the stacks ST1, ST2, ST3 and ST4 included in the organic layers OL is provided as a common layer in the entirety of the pixel regions PXA-R, PXA-B and PXA-G and the non-pixel regions NPXA. For example, each of the stacks ST1, ST2, ST3 and ST4 included in the light emitting device ED may have portions disposed on the pixel defining films PDL, and the portions of each of the stacks ST1, ST2, ST3 and ST4, which are disposed in the pixel regions PXA-R, PXA-B and PXA-G, may be connected to each other on the pixel defining films PDL to constitute a common layer having a shape of a single body. Accordingly, each of the functional layers and the light emitting layers disposed in the stacks ST1, ST2, ST3 and ST4 may also constitute a common layer having a shape of a single body in the entirety of the pixel regions PXA-R, PXA-B and PXA-G and the non-pixel regions NPXA. However, the disclosure is not limited thereto. Unlike that illustrated in FIG. 4, in an embodiment, at least some of the stacks ST1, ST2, ST3 and ST4 may be each provided to be patterned within an opening portion defined in the pixel defining film PDL. At least some of the stacks ST1, ST2, ST3 and ST4, or at least some of the functional layers and the light emitting layers included in the stacks ST1, ST2, ST3 and ST4, may be each patterned through an inkjet printing process and provided within the opening portion that is defined in the pixel defining film PDL so as to overlap each of the pixel regions PXA-R, PXA-B and PXA-G.

The thin film encapsulation layer TFE may be disposed on the light emitting device ED, and the thin film encapsulation layer TFE may be disposed on the second electrode EL2. The thin film encapsulation layer TFE may be disposed directly on the second electrode EL2. The thin film encapsulation layer TFE may have a single-layer structure or a structure in which multiple layers are stacked on each other. The thin film encapsulation layer TFE may include at least one insulation layer. The thin film encapsulation layer TFE according to an embodiment may include at least one inorganic film (hereinafter referred to as an inorganic encapsulation film). The thin film encapsulation layer TFE according to an embodiment may include at least one organic film (hereinafter referred to as an organic encapsulation film) and at least one inorganic encapsulation film.

The inorganic encapsulation film may protect the light emitting device ED from moisture or oxygen, and the organic encapsulation film may protect the light emitting device ED from foreign matters such as dust particles. The inorganic encapsulation film may include a silicon nitride, a silicon oxynitride, a silicon oxide, a titanium oxide, an aluminum oxide, and/or the like, and is not particularly limited thereto. The organic encapsulation film may include an acrylic compound, an epoxy-based compound, etc. The organic encapsulation film may include a photopolymerizable organic material and is not particularly limited.

Referring to FIG. 4, the display apparatus according to an embodiment may include the light control member CCM disposed on the display panel. The light control member CCM may include the upper base layer BL and the light control layer CCL disposed below the upper base layer BL. The light control layer CCL may include the banks BK disposed apart from each other, and the light control units CCP-R, CCP-B and CCP-G disposed between the banks BK. For example, the light control member CCM according to an embodiment may include the upper base layer BL, the banks BK disposed on the upper base layer BL, and the light control units CCP-R, CCP-B and CCP-G disposed between the banks BK spaced apart from each other. FIG. 4 illustrates that the upper base layer BL that provides a reference surface on which the light control layer CCL is disposed is separately provided. However, the disclosure is not limited thereto, and the light control layer CCL may be disposed on a reference surface provided by the thin film encapsulation layer TFE of the display device layer DP-EL.

The light control member CCM according to an embodiment may include the light control units CCP-R, CCP-B and CCP-G. The light control units CCP-R, CCP-B and CCP-G may include a first light control unit CCP-B that transmits light having a first wavelength, a second light control unit CCP-G that converts the light having the first wavelength into light having a second wavelength, and a third light control unit CCP-R that converts the light having the first wavelength or the light having the second wavelength into light having a third wavelength. The light having the second wavelength may be light in a longer wavelength region than the light having the first wavelength, and the light having the third wavelength may be light in a longer wavelength region than each of the light having the first wavelength and the light having the second wavelength. For example, the light having the first wavelength may be blue light, the light having the second wavelength may be green light, and the light having the third wavelength may be red light. The light having the first wavelength may be light in an emission wavelength region of about 410 nm to about 480 nm, the light having the second wavelength may be light in an emission wavelength region of about 500 nm to about 600 nm, and the light having the third wavelength may be light in an emission wavelength region of about 620 nm to about 700 nm. The light having the first wavelength and/or the second wavelength may be source light provided from the display panel DP to the light control layer CCL.

The first light control unit CCP-B, the second light control unit CCP-G, and the third light control unit CCP-R may each include a luminous body. The luminous body may be a particle that converts the wavelength of incident light to emit light having another wavelength. In an embodiment, the luminous body included in each of the second light control unit CCP-G and the third light control unit CCP-R may be a quantum dot or a fluorescent body. For example, the second light control unit CCP-G may include a quantum dot QD2 that converts the light having the first wavelength into the light having the second wavelength, and the third light control unit CCP-R may include a quantum dot QD3 that converts the light having the second wavelength or the light having the first wavelength into the light having the third wavelength. The first light control unit CCP-B may not include the luminous body such as a quantum dot. The first light control unit CCP-B may be a transmission unit that transmits the wavelength of the first light. However, the disclosure is not limited thereto, and the first light control unit CCP-B may include a quantum dot QD1 that converts the light having the second wavelength into the light having the first wavelength.

The quantum dot may be a particle that converts the wavelength of the light provided. The quantum dot may have a core selected from a Group II-VI compound, a Group III-VIIII-V compound, a Group I-III-VI compound, a Group III-V compound, a Group III-II-V compound, a Group IIII-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group I-III-VI compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and a mixture thereof, or a quaternary compound such as AgInGaS2 and CuInGaS2.

The Group III-V compound may be selected from the group consisting of a binary compound selected from the group consisting of GaN, GaP, GaAs, GaSb, AN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP or the like may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. A Group IV element may be selected from the group consisting of Si, Ge, and a mixture thereof. The Group IV compound may be a binary compound selected from the group consisting of SiC, SiGe, and a mixture thereof.

Here, the binary compound, the ternary compound, or the quaternary compound may be present in a particle with a uniform concentration distribution or may be present in the same particle with a partially different concentration distribution. The compound may have a core-shell structure in which one quantum dot surrounds another quantum dot. The core-shell structure may have a concentration gradient in which the concentration of elements present in the shell becomes lower toward a core.

In some embodiments, the quantum dot may have the above-described core-shell structure with a core including nanocrystals and a shell surrounding the core. The shell of the quantum dot may serve as a protective layer that prevents the chemical deformation of the core so as to maintain semiconductor properties, and/or serve as a charging layer so as to impart electrophoresis properties to the quantum dot. The shell may a single-layer structure or a multilayer structure. The shell of the quantum dot may be made of, for example, a metal or non-metal oxide, a semiconductor compound, a combination thereof, or the like.

For example, examples of the metal or nonmetal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$. However, the disclosure is not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc. However, the disclosure is not limited thereto.

The quantum dot may have a full width of half maximum (FWHM) in an emission wavelength spectrum of about 45 nm or less, in an embodiment about 40 nm or less, in an embodiment about 30 nm or less, and, in this range, the color purity or color reproducibility may be improved. Light emitted through such a quantum dot may be emitted in all directions so that a wide viewing angle may be improved.

The shape of the quantum dot may be one used in the relevant art and is not particularly limited. More specifically, the quantum dot may have a spherical shape, a pyramidal shape, or a multi-arm shape, or may be in the form of cubic nanoparticles, nanotubes, nanowires, nanofibers, nanoplate-shaped particles, or the like.

The quantum dot may adjust the color of emitted light according to the particle size thereof. Accordingly, the quantum dot may have various emission colors such as blue, red, and green. The smaller the particle size of the quantum dot becomes, the shorter the wavelength of light emitted may be. For example, the particle size of the quantum dot emitting green light may be smaller than the particle size of the quantum dot emitting red light. The particle size of the quantum dot emitting blue light may be smaller than the particle size of the quantum dot emitting green light.

Each of the light control units CCP-R, CCP-B and CCP-G included in the light control layer CCL may further include a scatterer SP. The first light control unit CCP-B may include a first quantum dot QD1 and a scatterer SP, the second light control unit CCP-G may include a second quantum dot QD2 and a scatterer SP, and the third light control unit CCP-R may include a third quantum dot QD3 and a scatterer SP. However, the disclosure is not limited thereto. The first quantum dot QD1 may be omitted in the first light control unit CCP-B, and the first light control unit CCP-B may include only the scatterer SP.

The scatterer SP may be an inorganic particle. For example, the scatterer SP may include at least one of $TiO_2$, ZnO, $Al_2O_3$, $SiO_2$, and hollow silica. The scatterer SP may include any one among $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP-B, the second light control unit CCP-G, and the third light control unit CCP-R may further include base resin BR1, BR2 and BR3 in which the quantum dots QD1, QD2 and QD3 and/or the scatterers SP are dispersed, respectively. In an embodiment, the first light control unit CCP-B may include the first quantum dot QD1 and the scatterer SP that are dispersed in a first base resin BR1, the second light control unit CCP-G may include the second quantum dot QD2 and the scatterer SP that are dispersed in a second base resin BR2, and the third light control unit CCP-R may include the third quantum dot QD3 and the scatterer SP that are dispersed in a third base resin BR3. The base resin BR1, BR2 and BR3*s* may be mediums in which the quantum dots QD1, QD2 and QD3 and the scatterers SP are dispersed, respectively, and may be composed of various resin compositions that may be generally referred to as a binder. For example, the base resins BR1, BR2 and BR3 may each be an acrylic resin, a urethane-based resin, a silicone resin, an epoxy-based resin, and/or the like. The base resins BR1, BR2 and BR3 may each be a transparent resin. In an embodiment, the first base resin BR1, the second base resin BR2, and the third base resin BR3 may be the same as or different from each other.

The banks BK may define an opening portion that discriminates each of the pixel regions PXA-R, PXA-B and PXA-G overlapping the light control layer CCL. The opening portion defined in the banks BK may be filled with each of the light control units CCP-R, CCP-B and CCP-G. The banks BK may each include a light absorbing material, or include a black pigment or a black dye.

The light control member CCM according to an embodiment may further include the color filter layer CFL. The color filter layer CFL may be disposed between the upper base layer BL and the light control layer CCL. The color filter layer CFL may include filters CF-B, CF-G and CF-R. The color filter layer CFL may include a first filter CF-B that transmits the light having the first wavelength, a second filter CF-G that transmits the light having the second wavelength, and a third filter CF-R that transmits the light having the third wavelength. For example, the first filter CF-B may be a blue filter, the second filter CF-G may be a green filter, and the third filter CF-R may be a red filter. The filters CF-B, CF-G and CF-R may each include a polymer photosensitive resin and a pigment or a dye. The first filter CF-B may include a blue pigment or dye, the second filter CF-G may include a green pigment or dye, and the third filter CF-R may include a red pigment or dye. However, the disclosure is not limited thereto, and the first filter CF-B may not include a pigment or a dye. The first filter CF-B may include a polymer photosensitive resin and not include a pigment or a dye. The first filter CF-B may be transparent. The first filter CF-B may be formed of a transparent photosensitive resin. In an embodiment, the second filter CF-G and the third filter CF-R may be yellow filters. The second filter CF-G and the third filter CF-R may be provided as a single body without being separated from each other.

In the color filter layer CFL, some of the filters CF-B, CF-G and CF-R may overlap each other. Two or more filters CF-B, CF-G and CF-R may overlap each other in the non-pixel regions NPXA. In case that the filters CF-B, CF-G and CF-R overlap each other, an effect of blocking external light may increase to serve as a black matrix. The overlap structure of the filters CF-B, CF-G and CF-R may serve to prevent mixture of colors.

The upper base layer BL may be disposed on the color filter layer CFL. The upper base layer BL may be a member that provides a base surface on which the color filter layer CFL, the light control layer CCL, and so on, are disposed. The upper base layer BL may be a glass substrate, a metal substrate, a plastic substrate, or the like. However, the disclosure is not limited thereto, and the upper base layer BL may be an inorganic layer, an organic layer, or a composite material layer. Unlike that illustrated, the upper base layer BL may be omitted in an embodiment.

Although not illustrated, the color filter layer CFL may further include a low refractive layer. The low refractive layer may be disposed between the filters CF-B, CF-G and CF-R and the light control layer CCL. The low refractive layer may have a refractive index of about 1.1 to about 1.5. The refractive index of the low refractive layer may be adjusted by the ratio of hollow inorganic particles and/or voids, etc. included in the low refractive layer.

Although not illustrated, the display module DM may further include an anti-reflection layer that is disposed above or below the color filter layer CFL and blocks external light incident into the display module DM. The anti-reflection layer may block a portion of the external light. The anti-reflection layer may reduce reflected light that occurs in the display panel DP due to the external light. The anti-reflection layer may be, for example, a polarizing layer. In an embodiment, the polarizing layer disposed below the upper base layer BL may be included and the color filter layer CFL may be omitted in the display module DM.

The light control member CCM may further include buffer layers BFL1 and BFL2 that block moisture, oxygen, and so on, and protect components disposed above and below the buffer layers BFL1 and BFL2. The buffer layers BFL1 and BFL2 may include a first buffer layer BFL1 and a second buffer layer BFL2. The first buffer layer BFL1 may be disposed between the thin film encapsulation layer TFE and the light control layer CCL. The second buffer layer BFL2 may be disposed between the light control layer CCL and the color filter layer CFL.

The first buffer layer BFL1 may be a layer that serves to prevent moisture and/or oxygen (hereinafter referred to as "moisture/oxygen") from permeating the light control layer CCL. The first buffer layer BFL1 may be disposed below the light control layer CCL to block the light control layer CCL from being exposed to moisture/oxygen. The first buffer layer BFL1 may include at least one inorganic layer. For example, the first buffer layer BFL1 may include an inorganic material. For example, the first buffer layer BFL1 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, or a silicon oxynitride, or a metal thin film having light transmittance or the like. The first buffer layer BFL1 may further include an organic film. The first buffer layer BFL1 may be constituted by a single layer or multiple layers.

The second buffer layer BFL2 may be a protective layer that protects the light control layer CCL and the color filter layer CFL. The second buffer layer BFL2 may be an inorganic matter layer including at least one inorganic matter of a silicon nitride, a silicon oxide, and/or a silicon oxynitride. The second buffer layer BFL2 may be constituted by a single layer or multiple layers.

Figure 5:
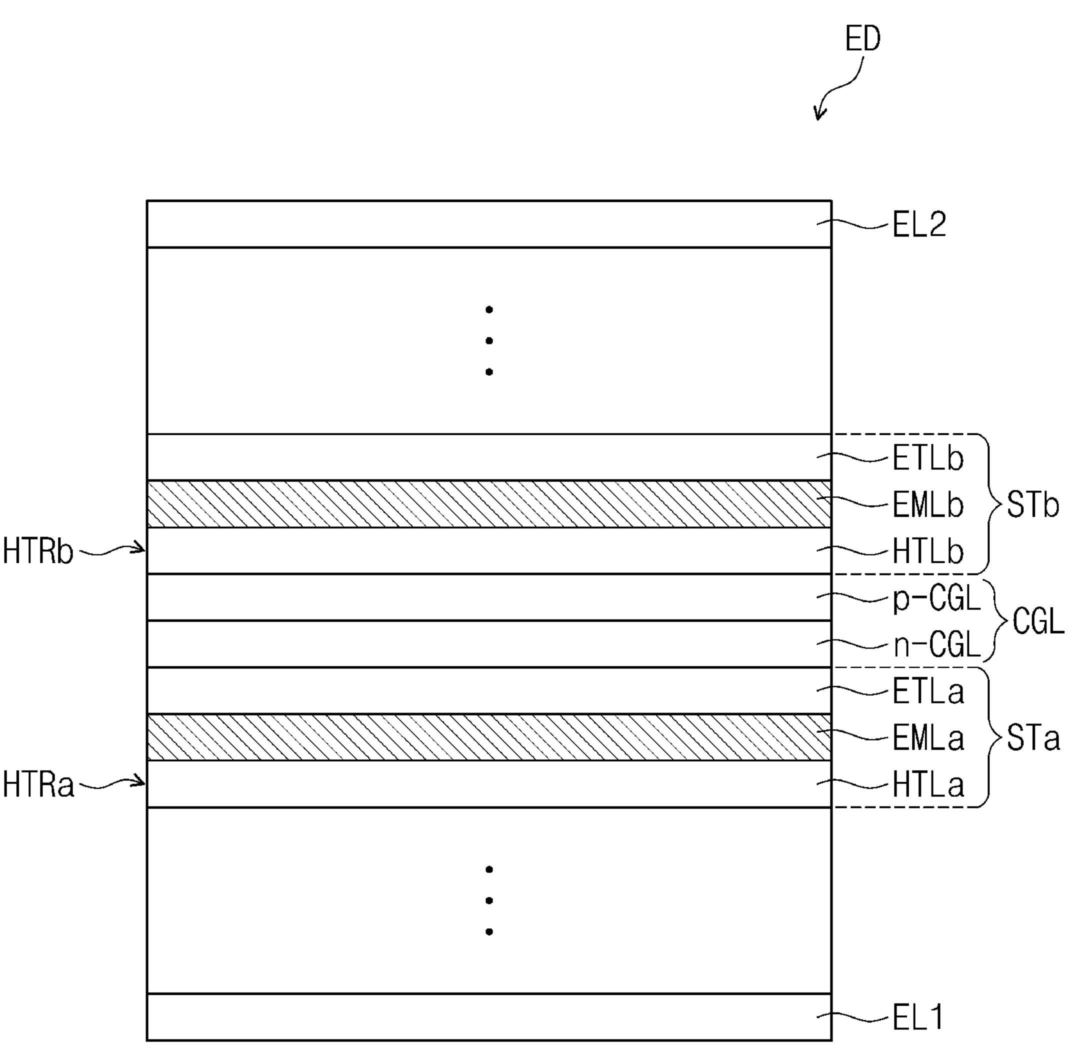
FIG. 5 is a schematic cross-sectional view illustrating a light emitting device according to an embodiment.

FIG. 5 is a schematic cross-sectional view illustrating a light emitting device according to an embodiment. Referring to FIG. 5, a light emitting device ED according to an embodiment may include a first electrode EL1, a second electrode EL2, a first light emitting stack STa, a charge generation layer CGL, and a second light emitting stack STb.

The light emitting device ED according to an embodiment may include at least two stacks, the first light emitting stack STa and the second light emitting stack STb, between the first electrode EL1 and the second electrode EL2. However, this is illustrated as an example, and the light emitting device ED according to an embodiment may include "n" stacks disposed between the first electrode EL1 and the second electrode EL2. "n" may be an integer of 2 or greater. For example, the light emitting device ED may include two stacks, three stacks, or four or more stacks. FIG. 5 illustrates a configuration in which other members may be disposed below the first light emitting stack STa or above the second light emitting stack STb. However, the first light emitting stack STa may be disposed directly on the first electrode EL1, and the second light emitting stack STb may be disposed directly below the second electrode EL2 as necessary.

The light emitting device ED according to an embodiment may include the first light emitting stack STa and the second light emitting stack STb. The second light emitting stack STb may be disposed on the first light emitting stack STa. The first light emitting stack Sta may include a first electron transport layer ETLa, and the second light emitting stack STb may include a second electron transport layer ETLb. The first light emitting stack STa may include a first light emitting layer EMLa, and the second light emitting stack STb may include a second light emitting layer EMLb. The first light emitting layer EMLa and the second light emitting layer EMLb may emit light having a first wavelength. The light having the first wavelength may be light in a blue wavelength spectrum. In an embodiment, the first wavelength may be about 420 nm to about 480 nm. In another embodiment, the second light emitting layer EMLb may emit light having a second wavelength. The light having the second wavelength may be light in a green wavelength spectrum. In an embodiment, the second wavelength may be about 500 nm to about 600 nm.

In the light emitting device ED according to an embodiment, the charge generation layer CGL may be disposed between the first light emitting stack STa and the second light emitting stack STb. In case that a voltage is applied, the charge generation layer CGL may generate charges (electrons and holes) by forming a complex through an oxidation-reduction reaction. The charge generation layer CGL may provide the generated charges for each of adjacent stacks STa and STb. The charge generation layer CGL may double the efficiency of a current generated in each of the adjacent stacks, and may serve to control the balance of charges between the adjacent stacks.

The charge generation layer CGL may include a p-type charge generation layer p-CGL and an n-type charge generation layer n-CGL. The charge generation layer CGL may have a layer structure in which the n-type charge generation layer n-CGL and the p-type charge generation layer p-CGL are bonded to each other. The charge generation layer CGL may promote movement of holes and/or charges. The n-type charge generation layer n-CGL may be a charge generation layer that provides electrons for adjacent stacks. The n-type charge generation layer n-CGL may be a layer having a base material doped with an n-dopant. The p-type charge generation layer p-CGL may be a charge generation layer that provides holes for adjacent stacks. The p-type charge generation layer p-CGL may be a layer having a base material doped with an p-dopant.

The first light emitting stack STa and the second light emitting stack STb according to an embodiment may include at least one of hole transport layers HTLa and HTLb. The hole transport layers HTLa and HTLb may include a first hole transport layer HTLa and a second hole transport layer HTLb. The first hole transport layer HTLa may be included in the first light emitting stack STa, and the second hole transport layer HTLb may be included in the second light emitting stack STb. The first hole transport layer HTLa may be disposed below the first light emitting layer EMLa, and the second hole transport layer HTLb may be disposed below the second light emitting layer EMLb.

The second hole transport layer HTLb may be disposed on the charge generation layer CGL. For example, the second hole transport layer HTLb may be disposed directly on the p-type charge generation layer p-CGL. Accordingly, the light emitting device ED according to an embodiment may have a structure in which the second hole transport layer HTLb is in contact with a surface of the p-type charge generation layer p-CGL.

The hole transport layers HTLa and HTLb may be included in hole transport regions HTRa and HTRb. The hole transport regions HTRa and HTRb may include at least the hole transport layers HTLa and HTLb and further include a hole-side additional layer. The hole-side additional layer may include at least one of a hole injection layer, a hole buffer layer, and an electron blocking layer. For example, the hole transport regions HTRa and HTRb may include the hole transport layers HTLa and HTLb and the hole injection layer disposed below the hole transport layers HTLa and HTLb. The hole transport regions HTRa and HTRb may include the hole transport layers HTLa and HTLb and the hole buffer layer disposed on the hole transport layers HTLa and HTLb.

In the light emitting device ED according to an embodiment, a material included in the hole transport layers HTLa and HTLb may be different from a material included in the charge generation layer CGL. For example, the material included in the hole transport layers HTLa and HTLb may be different from a material included in the p-type charge generation layer p-CGL. A material included in the second hole transport layer HTLb may be different from the material included in the p-type charge generation layer p-CGL. In an embodiment, the hole transport layers HTLa and HTLb and the p-type charge generation layer p-CGL may each include a host and a dopant, and a material included in the host of the hole transport layers HTLa and HTLb may be different from a material included in the host of the p-type charge generation layer p-CGL.

In the light emitting device ED according to an embodiment, a hole mobility of the charge generation layer CGL may be lower than a hole mobility of the hole transport layers HTLa and HTLb. In an embodiment, a hole mobility of the p-type charge generation layer p-CGL may be lower than the hole mobility of the hole transport layers HTLa and HTLb. The hole mobility of the p-type charge generation layer p-CGL may be lower than a hole mobility of the second hole transport layer HTLb. For example, the hole mobility of the p-type charge generation layer p-CGL may be about 50% to about 80% of the hole mobility of the second hole transport layer HTLb. Accordingly, a recombination region in which electrons and holes in the light emitting layer are combined with each other to generate excitons is close to the hole transport regions HTRa and HTRb so that a phenomenon in which singlet excitons are generated by collision of triplet excitons (triplet-triplet annihilation, TTA) may increase. Accordingly, the emission efficiency of the light emitting layers EMLa and EMLb may increase.

In the light emitting device ED according to an embodiment, a level of highest occupied molecular orbital (HOMO) of the charge generation layer CGL may be equal to or lower than a level of HOMO of the hole transport layers HTLa and HTLb. For example, a level of HOMO of the p-type charge generation layer p-CGL may be equal to or lower than the level of HOMO of the hole transport layers HTLa and HTLb. The HOMO level of the charge generation layer CGL and the hole transport layers HTLa and HTLb may be about −5.1 eV to about −5.3 eV. For example, the level of the charge generation layer CGL and the second hole transport layer HTLb may be about −5.1 eV to about −5.3 eV. Accordingly, the holes may be smoothly transported in the light emitting device ED to reach the light emitting layers EMLa and EMLb.

The hole transport layer HTLa may have a thickness of about 10 nm to about 500 nm, for example, about 10 nm to about 70 nm. In case that the hole transport regions HTRa and HTRb each include the hole-side additional layer, the hole-side additional layer may have a thickness of about 1 nm to about 100 nm. The charge generation layer CGL may have a thickness of about 1 nm to about 100 nm, for example, about 5 nm to about 50 nm. The p-type charge generation layer p-CGL may have a thickness of about 1 nm to about 10 nm. In case that the thickness of the hole transport layer HTLa or the thickness of the charge generation layer CGL satisfies the range as described above, satisfactory hole transporting properties may be achieved without a substantial increase in driving voltage.

Hereinafter, a light emitting device ED-1, ED-2 or ED-3 according to an embodiment including four stacks will be described in detail with reference to FIGS. 6A to 6C.

Figure 6A:
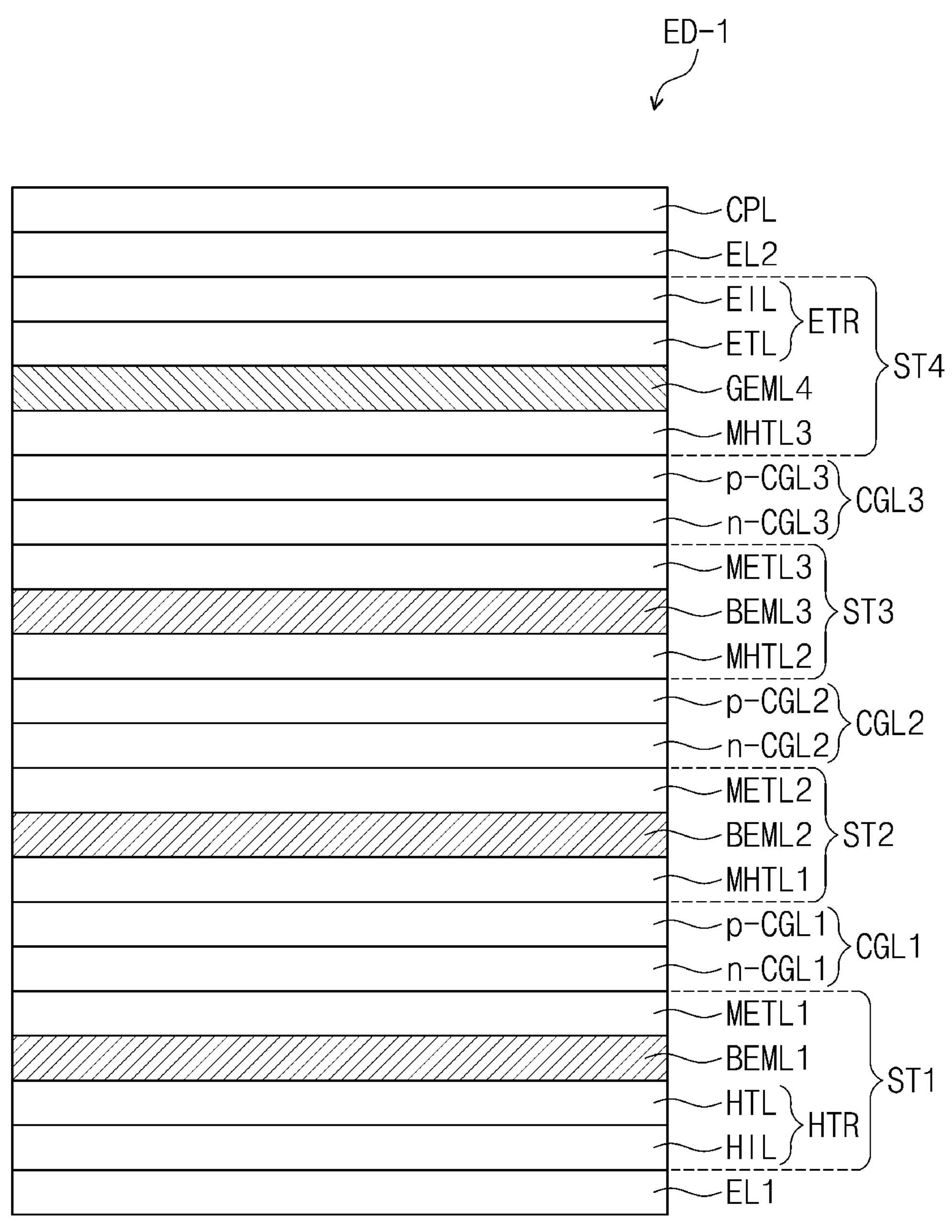
FIGS. 6A to 6C each are a schematic cross-sectional view illustrating a light emitting device according to an embodiment.
Figure 6B:
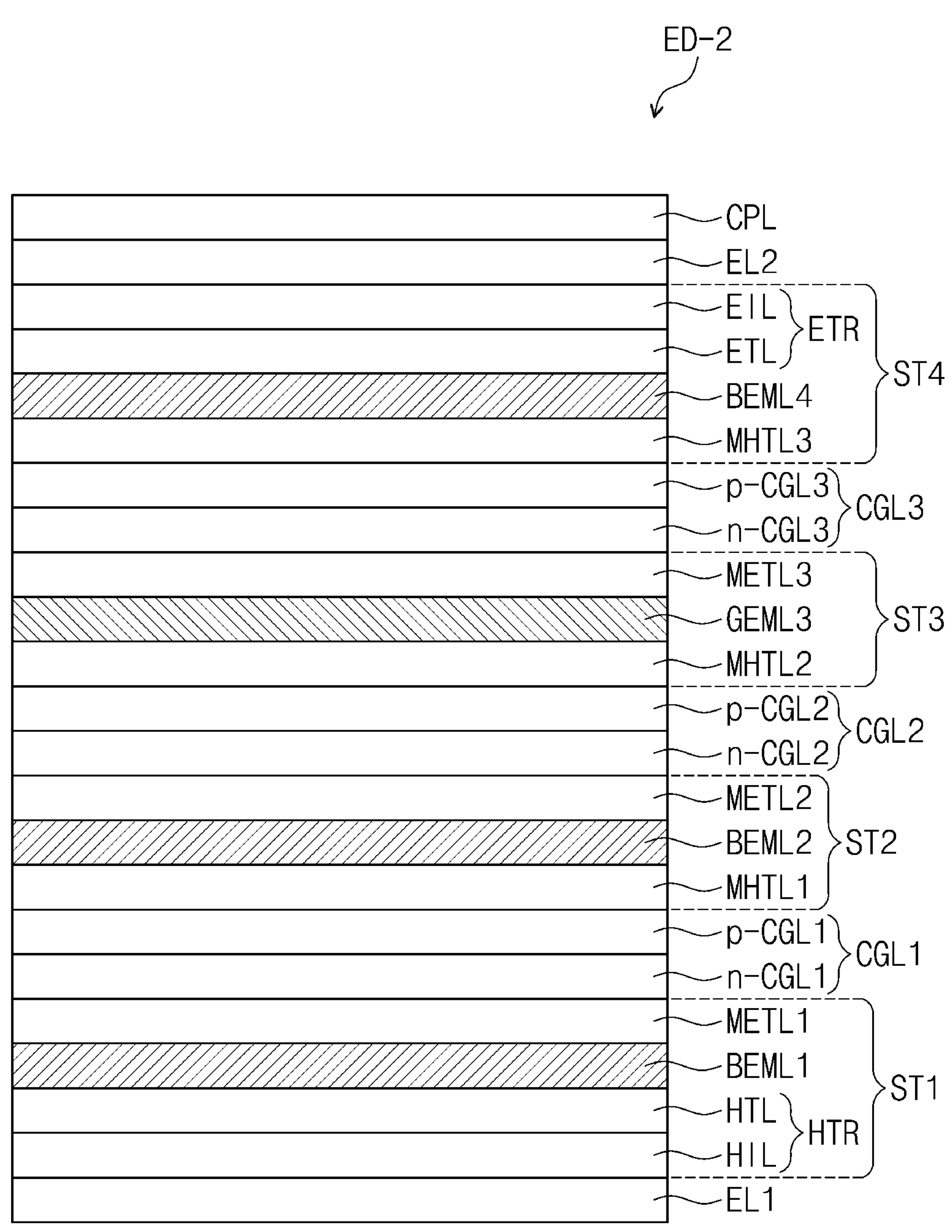
Figure 6C:
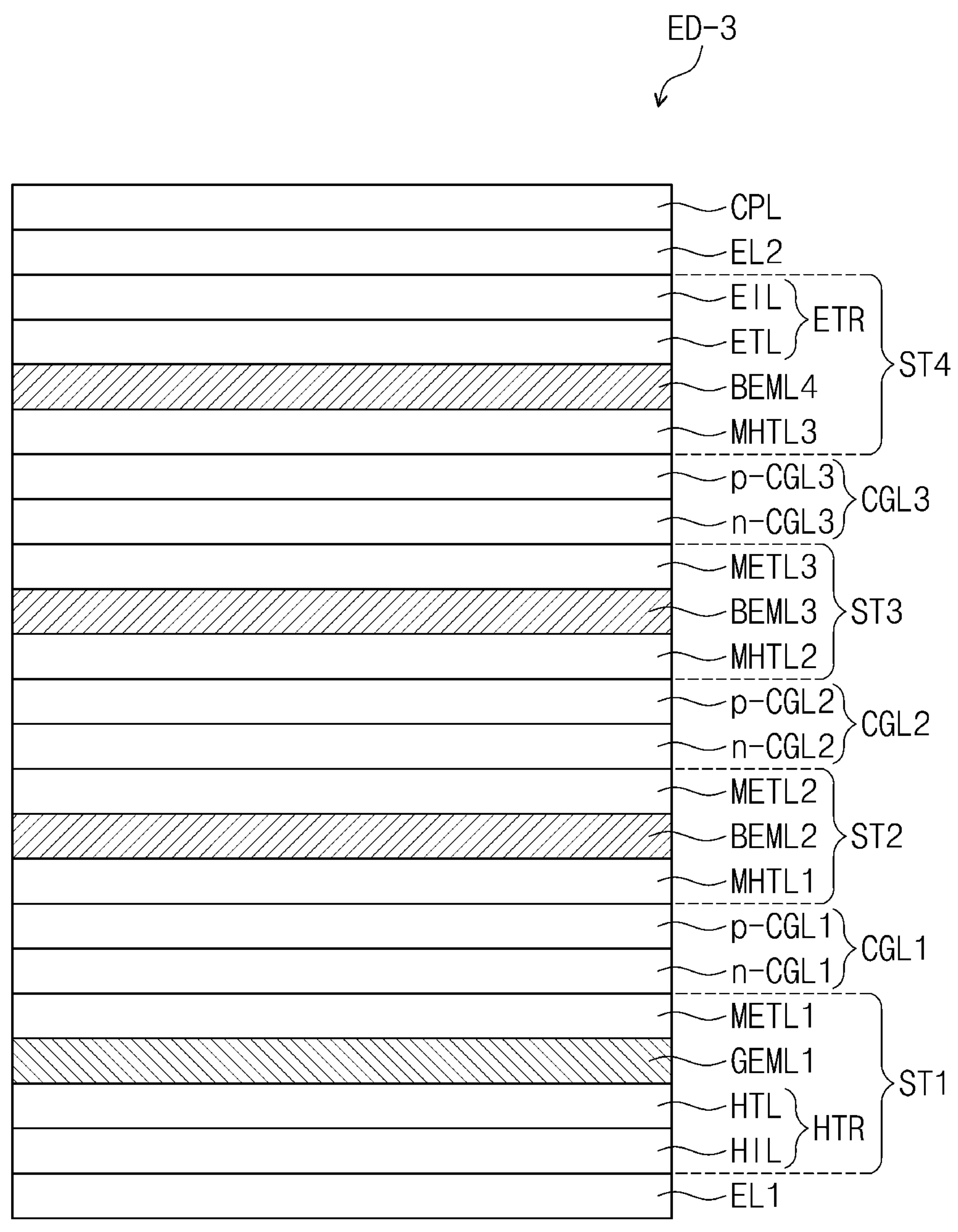

Referring to FIG. 5 together, each of the first light emitting stack STa and the second light emitting stack STb described above may correspond to any one among multiple stacks ST1, ST2, ST3 and ST4 illustrated in each of FIGS. 6A, 6B, and 6C. The charge generation layer CGL described above may correspond to any one among a first charge generation layer CGL1, a second charge generation layer CGL2, and a third charge generation layer CGL3. Each of the first hole transport layer HTLa and the second hole transport layer HTLb described above may correspond to any one among a first intermediate hole transport layer MHTL1, a second intermediate hole transport layer MHTL2, and a third intermediate hole transport layer MHTL3.

Referring to FIG. 6A, the light emitting device ED-1 according to an embodiment may include a first electrode EL1, a second electrode EL2 facing the first electrode EL1, and the multiple stacks ST1, ST2, ST3 and ST4 disposed between the first electrode EL1 and the second electrode EL2. The stacks ST1, ST2, ST3 and ST4 may include a first stack ST1, a second stack ST2, a third stack ST3, and a fourth stack ST4. The first stack ST1, the second stack ST2, the third stack ST3, and the fourth stack ST4 may each include a light emitting layer. FIG. 6A illustrates that the light emitting device ED-1 includes a total of four stacks ST1, ST2, ST3 and ST4. However, the disclosure is not limited thereto, and the light emitting device ED may include two, three, or five or more stacks. For example, the second stack ST2 and the third stack ST3 may be omitted in the structure of the light emitting device ED-1 illustrated in FIG. 6A, and a light emitting device structure having two stacks, the first stack ST1 and the fourth stack ST4, may be provided.

In the light emitting device ED-1 according to an embodiment, a hole transport region HTR and an electron transport region ETR may be disposed between the first electrode EL1 and the second electrode EL2. In an embodiment, the light emitting device ED-1 may emit light in a direction from the first electrode EL1 to the second electrode EL2. As an example, the light emitting device ED-1 according to an embodiment is illustrated as having a structure in which, on the basis of the direction in which the light is emitted, the hole transport region HTR is in contact with a top surface of the first electrode EL1 and the electron transport region ETR is in contact with a bottom surface of the second electrode EL2. However, the disclosure is not limited thereto, and the light emitting device ED-1 according to an embodiment may have an inverted device structure in which, on the basis of the direction in which the light is emitted, the electron transport region ETR is in contact with the top surface of the first electrode EL1 and the hole transport region HTR is in contact with the bottom surface of the second electrode EL2.

The light emitting device ED-1 according to an embodiment may include charge generation layers CGL1, CGL2 and CGL3, each of which is disposed between the stacks ST1, ST2, ST3 and ST4. The light emitting device ED-1 according to an embodiment may include a first charge generation layer CGL1 disposed between the first stack ST1 and the second stack ST2, a second charge generation layer CGL2 disposed between the second stack ST2 and the third stack ST3, and a third charge generation layer CGL3 disposed between the third stack ST3 and the fourth stack ST4.

In the light emitting device ED-1 according to an embodiment, the first stack ST1, the second stack ST2, and the third stack ST3 may each include blue light emitting layers BEML1, BEML2 and BEML3 that emit light having a first wavelength. The light having the first wavelength may be light in a blue wavelength spectrum. In an embodiment, the first wavelength may be about 420 nm to about 480 nm. The blue light emitting layers BEML1, BEML2 and BEML3 may each include an organic material that emits light having a wavelength of about 420 nm to about 480 nm. The blue light emitting layers BEML1, BEML2 and BEML3 may each include, for example, a host and a dopant.

In the light emitting device ED-1 according to an embodiment, the fourth stack ST4 may include a green light emitting layer GEML4 that emits light having a second wavelength. The light having the second wavelength may be light in a green wavelength spectrum. In an embodiment, the second wavelength may be about 520 nm to about 600 nm. The green light emitting layer GEML4 may include an organic material that emits light having a wavelength of about 520 nm to about 600 nm. The green light emitting layer GEML4 may include, for example, a host and a dopant. The number 1, 2, 3 or 4 following the reference symbol of each of the blue light emitting layer BEML and the green light emitting layer GEML is used herein to indicate what numberth stack is a stack in which each of the light emitting layers is included.

The first stack ST1 may further include the hole transport region HTR that transports holes provided from the first electrode EL1 to the blue light emitting layer BEML1, and a first intermediate electron transport region that transports electrons generated from the first charge generation layer CGL1 to the blue light emitting layer BEML1.

In the light emitting device ED-1 according to an embodiment, the hole transport region HTR may include a hole injection layer HIL disposed on the first electrode EL1, and a hole transport layer HTL disposed on the hole injection layer HIL. The hole transport layer HTL may be in contact with a bottom surface of the blue light emitting layer BEML1. However, the disclosure is not limited thereto, and the hole transport region HTR may further include a hole-side additional layer disposed on the hole transport layer HTL. The hole-side additional layer may include at least one of a hole buffer layer, an auxiliary light emitting layer, or an electron blocking layer. The hole buffer layer may be a layer that compensates for a resonance distance according to the wavelength of light emitted from the light emitting layer to improve the emission efficiency. The electron blocking layer may be a layer that serves to block the electrons from being injected from the electron transport region into the hole transport region.

The first intermediate electron transport region may include a first intermediate electron transport layer METL1 disposed on a first blue light emitting layer BEML1. The first intermediate electron transport layer METL1 may be disposed between the first blue light emitting layer BEML1 and the first charge generation layer CGL1 and in contact with each of the first blue light emitting layer BEML1 and the first charge generation layer CGL1. However, the disclosure is not limited thereto, and the first intermediate electron transport region may further include a first intermediate electron-side additional layer disposed between the first intermediate electron transport layer METL1 and the first blue light emitting layer BEML1. The first intermediate electron-side additional layer may include at least one of an electron buffer layer and a hole blocking layer. A first intermediate electron injection layer may be disposed between the first intermediate electron transport layer METL1 and the first charge generation layer CGL1.

The second stack ST2 may further include a first intermediate hole transport region that transports holes generated from the first charge generation layer CGL1 to a second blue light emitting layer BEML2, and a second intermediate electron transport region that transports electrons provided from the second charge generation layer CGL2 to the second blue light emitting layer BEML2.

The first intermediate hole transport region may include the first intermediate hole transport layer MHTL1 on the first charge generation layer CGL1. The first intermediate hole transport layer MHTL1 may be in contact with a bottom surface of the second blue light emitting layer BEML2. However, the disclosure is not limited thereto, and, in the first intermediate hole transport region, a first intermediate hole injection layer may be further disposed below the first intermediate hole transport layer MHTL1. The first intermediate hole transport region may further include a first intermediate hole-side additional layer disposed on the first intermediate hole transport layer MHTL1. The first intermediate hole-side additional layer may include at least one of a hole buffer layer, an auxiliary light emitting layer, and an electron blocking layer.

The second intermediate electron transport region may include a second intermediate electron transport layer METL2 disposed on the second blue light emitting layer BEML2. The second intermediate electron transport layer METL2 may be disposed between the second blue light emitting layer BEML2 and the second charge generation layer CGL2 and in contact with each of the second blue light emitting layer BEML2 and the second charge generation layer CGL2. However, the disclosure is not limited thereto, and the second intermediate electron transport region may further include a second intermediate electron-side additional layer disposed between the second intermediate electron transport layer METL2 and the second blue light emitting layer BEML2. The second intermediate electron-side additional layer may include at least one of an electron buffer layer and a hole blocking layer. A second intermediate electron injection layer may be disposed between the second intermediate electron transport layer METL2 and the second charge generation layer CGL2.

The third stack ST3 may further include a second intermediate hole transport region that transports holes generated from the second charge generation layer CGL2 to a third blue light emitting layer BEML3, and a third intermediate electron transport region that transports electrons provided from the third charge generation layer CGL3 to the third blue light emitting layer BEML3.

The second intermediate hole transport region may include the second intermediate hole transport layer MHTL2 disposed on the second charge generation layer CGL2. The second intermediate hole transport layer MHTL2 may be in contact with a bottom surface of the third blue light emitting layer BEML3. However, the disclosure is not limited thereto, and, in the second intermediate hole transport region, a second intermediate hole injection layer may be further disposed below the second intermediate hole transport layer MHTL2. The second intermediate hole transport region may further include a second intermediate hole-side additional layer disposed on the second intermediate hole transport layer MHTL2. The second intermediate hole-side additional layer may include at least one of a hole buffer layer, an auxiliary light emitting layer, and an electron blocking layer.

The third intermediate electron transport region may include a third intermediate electron transport layer METL3 disposed on the third blue light emitting layer BEML3. The third intermediate electron transport layer METL3 may be disposed between the third blue light emitting layer BEML3 and the third charge generation layer CGL3 and in contact with each of the third blue light emitting layer BEML3 and the third charge generation layer CGL3. However, the disclosure is not limited thereto, and the third intermediate electron transport region may further include a third intermediate electron-side additional layer disposed between the third intermediate electron transport layer METL3 and the third blue light emitting layer BEML3. The third intermediate electron-side additional layer may include at least one of an electron buffer layer and a hole blocking layer. A third intermediate electron injection layer may be disposed between the third intermediate electron transport layer METL3 and the third charge generation layer CGL3.

The fourth stack ST4 may further include a third intermediate hole transport region that transports holes generated from the third charge generation layer CGL3 to the green light emitting layer GEML4, and the electron transport region ETR that transports electrons provided from the second electrode EL2 to the green light emitting layer GEML4.

The third intermediate hole transport region may include the third intermediate hole transport layer MHTL3 disposed on the third charge generation layer CGL3. The third intermediate hole transport layer MHTL3 may be in contact with a bottom surface of the green light emitting layer GEML4. However, the disclosure is not limited thereto, and, in the third intermediate hole transport region, a third intermediate hole injection layer may be further disposed below the third intermediate hole transport layer MHTL3. The third intermediate hole transport region may further include a third intermediate hole-side additional layer disposed on the third intermediate hole transport layer MHTL3. The third intermediate hole-side additional layer may include at least one of a hole buffer layer, an auxiliary light emitting layer, and an electron blocking layer.

The electron transport region ETR may include an electron transport layer ETL disposed on the green light emitting layer GEML4, and an electron injection layer EIL disposed on the electron transport layer ETL. The electron transport layer ETL may be in contact with the green light emitting layer GEML4. However, the disclosure is not limited thereto, and the electron transport region ETR may further include an electron-side additional layer disposed between the electron transport layer ETL and the green light emitting layer GEML4. The electron-side additional layer may include at least one of an electron buffer layer and a hole blocking layer.

Referring to FIGS. 6B and 6C, in the light emitting devices ED-2 and ED-3 according to an embodiment, the green light emitting layer GEML may be included in another stack but not in the fourth stack ST4, in case compared to the light emitting device ED-1 illustrated in FIG. 6A. For example, like the light emitting device ED-2 according to an embodiment illustrated in FIG. 6B, the third stack ST3 may include the green light emitting layer GEML3, and the first stack ST1, the second stack ST2, and the fourth stack ST4 may include the blue light emitting layers BEML1, BEML2 and BEML4, respectively. In another embodiment, like the light emitting device ED-3 according to an embodiment illustrated in FIG. 6C, the first stack ST1 may include the green light emitting layer GEML1, and the second stack ST2, the third stack ST3, and the fourth stack ST4 may include the blue light emitting layers BEML2, BEML3, and BEML4, respectively. Although not illustrated, the second stack ST2 may include the green light emitting layer, and the other stacks, the first stack ST1, the third stack ST3, and the fourth stack ST4, may each include the blue light emitting layer.

Referring to FIGS. 5 and 6A to 6C together, in the light emitting devices ED-1, ED-2 and ED-3 according to an embodiment, the first electrode EL1 has conductivity. The first electrode EL1 may be formed of a metal material, a metal alloy, or a conductive compound. The first electrode EL1 may be an anode or a cathode. However, the disclosure is not limited thereto. The first electrode EL1 may be a pixel electrode.

In the light emitting devices ED-1, ED-2 and ED-3 according to an embodiment, the first electrode EL1 may be a reflective electrode. For example, the first electrode EL1 may include Ag, Mg, Cu, Al, Pt, Pd, Au, Ni, Nd, Ir, Cr, Li, Ca, LiF/Ca, LiF/Al, Mo, Ti, W, In, Zn, and/or Sn, which may have a high reflectance, or a compound or mixture thereof (e.g., a mixture of Ag and Mg). The first electrode EL1 may have a multilayer structure including a reflection film formed of the foregoing material, and a transparent conductive film formed of an indium tin oxide (ITO), an indium zinc oxide (IZO), a zinc oxide (ZnO), an indium tin zinc oxide (ITZO), etc. For example, the first electrode EL1 may have a two-layer structure of ITO/Ag or a three-layer structure of ITO/Ag/ITO, but is not limited thereto. The disclosure is not limited thereto, and the first electrode EL1 may include the foregoing metal material, a combination of two or more metal materials selected from the foregoing metal materials, an oxide of the foregoing metal material, or the like. The first electrode EL1 may have a thickness of about 70 nm to about 1000 nm. For example, the thickness of the first electrode EL1 may be about 100 nm to about 300 nm.

In the light emitting devices ED-1, ED-2 and ED-3 according to an embodiment, the charge generation layers CGL1, CGL2 and CGL3 may include n-type charge generation layers n-CGL1, n-CGL2 and n-CGL3 and p-type charge generation layers p-CGL1, p-CGL2 and p-CGL3, respectively. The charge generation layers CGL1, CGL2 and CGL3 may have layer structures in which the n-type charge generation layers n-CGL1, n-CGL2 and n-CGL3 are bonded to the p-type charge generation layers p-CGL1, p-CGL2 and p-CGL3, respectively. The first charge generation layer CGL1 may have a layer structure in which a first n-type charge generation layer n-CGL1 and a first p-type charge generation layer p-CGL1 are bonded to each other. The second charge generation layer CGL2 may have a layer structure in which a second n-type charge generation layer n-CGL2 and a second p-type charge generation layer p-CGL2 are bonded to each other. The third charge generation layer CGL3 may have a layer structure in which a third n-type charge generation layer n-CGL3 and a third p-type charge generation layer p-CGL3 are bonded to each other.

Each of the n-type charge generation layers n-CGL1, n-CGL2 and n-CGL3 may be a charge generation layer that provides adjacent stacks with electrons. Each of the n-type charge generation layers n-CGL1, n-CGL2 and n-CGL3 may be a layer having a base material doped with an n-dopant. Each of the p-type charge generation layers p-CGL1, p-CGL2 and p-CGL3 may be a charge generation layer that provides adjacent stacks with holes. Each of the p-type charge generation layers n-CGL1, n-CGL2 and n-CGL3 may be a layer having a base material doped with a p-dopant. Although not illustrated, buffer layers may be further disposed between the n-type charge generation layer n-CGL1, n-CGL2 and n-CGL3 and the p-type charge generation layer p-CGL1, p-CGL2 and p-CGL3, respectively.

Each of the charge generation layers CGL1, CGL2 and CGL3 may include an n-type aryl amine-based material or p-type metal oxide. For example, each of the n-type charge generation layers n-CGL1, n-CGL2 and n-CGL3 may include a charge-generating mixture including an aryl amine-based organic compound or organic compounds. Each of the p-type charge generation layers p-CGL1, p-CGL2 and p-CGL3 may include a charge-generating compound including a metal, an oxide, carbide or fluoride of a metal, an organic compound, or a mixture thereof.

For example, the aryl amine-based organic compound included in the n-type charge generation layers n-CGL1, n-CGL2 and n-CGL3 may be α-NPD, 2-TNATA, TDATA, MTDATA, sprio-TAD, and/or sprio-NPB. For example, the metal included in the p-type charge generation layers p-CGL1, p-CGL2 and p-CGL3 may be cesium (Cs), molybdenum (Mo), vanadium(V), titanium (Ti), tungsten (W), barium (Ba), and/or lithium (Li). The oxide, carbide, or fluoride of a metal included in the p-type charge generation layers p-CGL1, p-CGL2 and p-CGL3 may be $Re_2O_7$, $MoO_3$, $V_2O_5$, $WO_3$, $TiO_2$, $Cs_2CO_3$, BaF, LiF, and/or CsF. In one example, the organic compound included in the p-type charge generation layers p-CGL1, p-CGL2 and p-CGL3 may be a cyano group-containing compound such as dipyrazino[2,3-f:2',3'-h] quinoxaline-2,3,6,7,10,11-hexacarbonitrile (HATCN) or 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9).

In the light emitting devices ED-1, ED-2 and ED-3 according to an embodiment, the hole transport region HTR and the intermediate hole transport region may each have a single layer made of a single material, or a single layer made of multiple different materials, or may have a multilayer structure having multiple layers made of multiple different materials.

The hole transport region HTR and the intermediate hole transport region may each be formed by using various methods such as vacuum deposition, spin coating, casting, Langmuir-Blodgett (LB) deposition, inkjet printing, laser printing, and/or laser induced thermal imaging (LITI).

The hole transport region HTR and the intermediate hole transport region may each include a phthalocyanine compound such as copper phthalocyanine, $N^1$,$N^{1'}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamine]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium [Tetrakis(pentafluorophenyl)borate], dipyrazino[2,3-f: 2',3'-h] quinoxaline-2,3,6,7,10,11-hexacarbonitrile (HATCN), etc.

The hole transport region HTR and the intermediate hole transport region may each include a carbazole derivative such as N-phenyl carbazole or polyvinyl carbazole, a fluorene-based derivative, a triphenylamine-based derivative such as N,N'-bis(3-methylphenyl)-N,N'-diphenyl-[1,1'-biphenyl]-4,4'-diamine (TPD) or 4,4',4"-tris(N-carbazolyl)triphenylamine (TCTA), N,N'-di(naphthalene-1-yl)-N,N'-diphenyl-benzidine (NPB), 4,4'-Cyclohexylidene bis[N,N-bis(4-methylphenyl)benzenamine] (TAPC), 4,4'-Bis[N,N'-(3-tolyl)amino]-3,3'-dimethylbiphenyl (HMTPD), 1,3-Bis(N-carbazolyl)benzene (mCP), etc.

The hole transport region HTR and the intermediate hole transport region may each include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), or the like.

In the hole transport region HTR and the intermediate hole transport region, the foregoing compounds of the hole transport region may be included in at least one of the intermediate hole injection layer, the intermediate hole transport layers MHTL1, MHTL2 and MHTL3, and the intermediate hole-side additional layer.

In the light emitting devices ED-1, ED-2 and ED-3 according to an embodiment, the intermediate hole transport layers MHTL1, MHTL2 and MHTL3 may be disposed directly on the charge generation layers CGL1, CGL2 and CGL3, respectively. In one example, the intermediate hole transport layers MHTL1, MHTL2 and MHTL3 may be disposed directly on top surfaces of the p-type charge generation layers p-CGL1, p-CGL2 and p-CGL3, respectively. Accordingly, the light emitting devices ED-1, ED-2 and ED-3 according to an embodiment may have structures in which the intermediate hole transport layers MHTL1, MHTL2 and MHTL3 are in contact with the top surfaces of the p-type charge generation layers p-CGL1, p-CGL2 and p-CGL3, respectively.

In the light emitting devices ED-1, ED-2 and ED-3 according to an embodiment, a hole mobility of the intermediate hole transport layers MHTL1, MHTL2 and MHTL3 may be higher than a hole mobility of the charge generation layers CGL1, CGL2 and CGL3. More specifically, a hole mobility of each of the intermediate hole transport layers MHTL1, MHTL2 and MHTL3 may be higher than a hole mobility of each of the p-type charge generation layers p-CGL1, p-CGL2 and p-CGL3. For example, a hole mobility of the first intermediate hole transport layer MHTL1 may be higher than a hole mobility of the first p-type charge generation layer p-CGL1, and a hole mobility of the second intermediate hole transport layer MHTL2 may be higher than a hole mobility of the second p-type charge generation layer p-CGL2. In another embodiment, the hole mobility of the first intermediate hole transport layer MHTL1 may be higher than the hole mobility of the first p-type charge generation layer p-CGL1, the hole mobility of the second intermediate hole transport layer MHTL2 may be higher than the hole mobility of the second p-type charge generation layer p-CGL2, and a hole mobility of the third intermediate hole transport layer MHTL3 may be higher than a hole mobility of the third p-type charge generation layer p-CGL3.

In the light emitting devices ED-1, ED-2 and ED-3 according to an embodiment, a material included in the intermediate hole transport layers MHTL1, MHTL2 and MHTL3 may be different from a material included in the charge generation layers CGL1, CGL2 and CGL3. More specifically, a material included in each of the intermediate hole transport layers MHTL1, MHTL2 and MHTL3 may be different from a material included in each of the charge generation layers CGL1, CGL2 and CGL3. For example, a material included in the first intermediate hole transport layer MHTL1 may be different from a material included in the first p-type charge generation layer p-CGL1, and a material included in the second intermediate hole transport layer MHTL2 may be different from a material included in the second p-type charge generation layer p-CGL2. For example, the intermediate hole transport layers MHTL1, MHTL2 and MHTL3 may include N,N'-bis(3-methylphenyl)-N,N'-diphenyl-[1,1'-biphenyl]-4,4'-diamine (TPD), and the p-type charge generation layers p-CGL1, p-CGL2 and p-CGL3 may include N,N'-di(naphthalene-1-yl)-N,N'-diphenyl-benzidine (NPB). However, the disclosure is not limited thereto, and the material included in each of the intermediate hole transport layers MHTL1, MHTL2 and MHTL3 and the p-type charge generation layers p-CGL1, p-CGL2 and p-CGL3 may be different as necessary.

In addition to the foregoing materials, the hole transport region HTR and the intermediate hole transport region may further include a charge-generating material so as to improve the conductivity. The charge-generating material may be dispersed uniformly or non-uniformly in the hole transport regions HTRa and HTRb. The charge-generating material may be, for example, a p-type dopant. The p-type dopant may include at least one of a metal halide compound, a quinone derivative, a metal oxide, and a cyano group-containing compound, but is not limited thereto. For example, the p-type dopant may include a metal halide compound such as CuI and RbI, a quinone derivative such as Tetracyanoquinodimethane (TCNQ) and 2,3,5,6-tetrafluoro-7,7'8,8-tetracyanoquinodimethane (F4-TCNQ), a metal oxide such as a tungsten oxide and a molybdenum oxide, or the like. However, the disclosure is not limited thereto.

The blue light emitting layers BEML1, BEML2 and BEML3 and the green light emitting layer GEML4 may each be provided on the hole transport region HTR or the intermediate hole transport region. The first blue light emitting layer BEML1 is provided on the hole transport region HTR, the second blue light emitting layer BEML2 is provided on the first intermediate hole transport layer MHTL1, the third blue light emitting layer BEML3 is provided on the second intermediate hole transport layer MHTL2, and the fourth green light emitting layer GEML4 is provided on the third intermediate hole transport layer MHTL3.

Each of the electron transport region ETR and the intermediate electron transport region may be disposed on the blue light emitting layers BEML1, BEML2 and BEML3 or the green light emitting layer GEML4. The electron transport region ETR and the intermediate electron transport region may each have a single layer made of a single material, or a single layer made of multiple different materials, or may have a multilayer structure having multiple layers made of multiple different materials.

The electron transport region ETR and the intermediate electron transport region may each be formed by using various methods such as vacuum deposition, spin coating, casting, Langmuir-Blodgett (LB) deposition, inkjet printing, laser printing, and/or laser induced thermal imaging (LITI).

The electron transport region ETR and the intermediate electron transport region may each include an anthracene-based compound. However, the disclosure is not limited thereto, and the electron transport region ETR and the intermediate electron transport region may each include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine (T2T), 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato)aluminum (BAlq), berylliumbis(benzoquinolin-10-olate) ($Bebq_2$), 9,10-di(naphthalene-2-yl) anthracene (ADN), 1,3-bis[3,5-di(pyridin-3-yl)phenyl] benzene (BmPyPhB), or a mixture thereof.

The electron transport region ETR and the intermediate electron transport region may each include a metal halide such as LiF, NaCl, CsF, RbCl, RbI, CuI, and KI, a lanthanum group metal such as Yb, or a co-deposited material of the metal halide and the lanthanum group metal. For example, the electron transport region ETR and the intermediate electron transport region may each include KI:Yb, RbI:Yb, or the like, as a co-deposited material. The electron transport region ETR and the intermediate electron transport region may each include a metal oxide such as $Li_2O$ or BaO, or 8-hydroxyl-Lithium quinolate (Liq) or the like, but the disclosure is not limited thereto. The electron transport region ETR and the intermediate electron transport region may each be made of a mixture of an electron-transporting material and an insulating organo metal salt. The organo metal salt may be a material having an energy band gap of about 4 eV or greater. Specifically, for example, the organo metal salt may include a metal acetate, a metal benzoate, a metal acetoacetate, a metal acetylacetonate, or a metal stearate.

In addition to the foregoing materials, the electron transport region ETR and the intermediate electron transport region may each further include at least one of 2,9-dimethyl-4,7-diphenyl-1,10-phenanthroline (BCP) and 4,7-diphenyl-1,10-phenanthroline (Bphen), but the disclosure is not limited thereto.

In the electron transport region ETR, the electron injection layer EIL or the electron transport layer ETL may include the foregoing compounds of the electron transport region. In case that the electron transport region ETR includes the electron-side additional layer, the electron-side additional layer may include the foregoing material. In the intermediate electron transport region, the intermediate electron transport layers METL1, METL2 and METL3 may include the foregoing compounds of the electron transport region. In the intermediate electron transport region, the intermediate electron-side additional layer or the intermediate electron injection layer may include the foregoing compounds of the electron transport region.

The electron transport region ETR and the intermediate electron transport region may each have a thickness of, for example, about 100 nm to about 150 nm. The electron transport layer ETL may have a thickness of about 0.1 nm to about 100 nm, for example, about 0.3 nm to about 50 nm. In case that the thickness of the electron transport layer ETL satisfies the range as described above, satisfactory electron transporting properties may be achieved without a substantial increase in driving voltage. The electron injection layer EIL may have a thickness of about 0.1 nm to about 10 nm, or about 0.3 nm to about 9 nm. In case that the thickness of the electron injection layer EIL satisfies the range as described above, satisfactory electron injecting properties may be achieved without a substantial increase in driving voltage. The intermediate electron transport layers METL1, METL2 and METL3 included in the intermediate electron transport region may each have a thickness of about 0.1 nm to about 100 nm, for example, about 0.1 nm to about 50 nm.

The first electrode EL1 may be provided on the electron transport region ETR. The second electrode EL2 may be a common electrode. The second electrode EL2 may be a cathode or an anode, but the disclosure is not limited thereto. For example, in case that the first electrode EL1 is an anode, the second electrode EL2 may be a cathode, and in case that the first electrode EL1 is a cathode, the second electrode EL2 may be an anode.

The second electrode EL2 may be a transflective electrode or a transmissive electrode. In case that the second electrode EL2 is the transmissive electrode, the second electrode EL2 may be made of a transparent metal oxide, for example, an indium tin oxide (ITO), an indium zinc oxide (IZO), a zinc oxide (ZnO), an indium tin zinc oxide (ITZO), etc.

In case that the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, or a compound or mixture thereof (e.g., AgMg, AgYb, or MgAg). The second electrode EL2 may have a multilayer structure including a reflective film or transflective film formed of the foregoing material, and a transparent conductive film formed of an indium tin oxide (ITO), an indium zinc oxide (IZO), a zinc oxide (ZnO), an indium tin zinc oxide (ITZO), etc. For example, the second electrode EL2 may include the foregoing metal material, a combination of two or more metal materials selected from the foregoing metal materials, an oxide of the foregoing metal material, or the like.

Although not illustrated, the second electrode EL2 may be connected to an auxiliary electrode. In case that the second electrode EL2 is connected to the auxiliary electrode, resistance of the second electrode EL2 may be reduced.

A capping layer CPL may be further disposed on the second electrode EL2 of the light emitting device ED-1, ED-2 or ED-3 according to an embodiment. The capping layer CPL may include multiple layers or a single layer.

In an embodiment, the capping layer CPL may be an organic layer or an inorganic layer. For example, in case that the capping layer CPL includes an inorganic matter, the inorganic matter may include an alkali metal compound such as LiF, an alkaline earth metal compound such as $MgF_2$, SiON, SiNX, SiOy, etc.

For example, in case that the capping layer CPL includes an organic matter, the organic matter may include α-NPD, NPB, TPD, m-MTDATA, $Alq_3$, CuPc, N4,N4, N4', N4'-tetra (biphenyl-4-yl) biphenyl-4,4'-diamine (TPD15), 4,4',4"-tris (carbazol sol-9-yl) triphenylamine (TCTA), etc., or include an epoxy resin, or acrylate such as methacrylate. However, the disclosure is not limited thereto, and the capping layer CPL may include at least one of compounds P1 to P5 as below.

P1

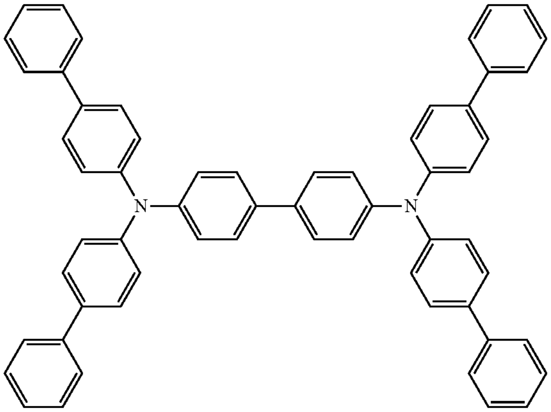

P2

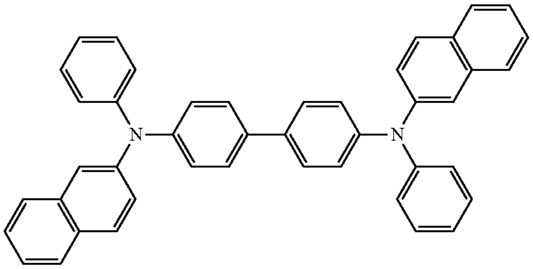

P3

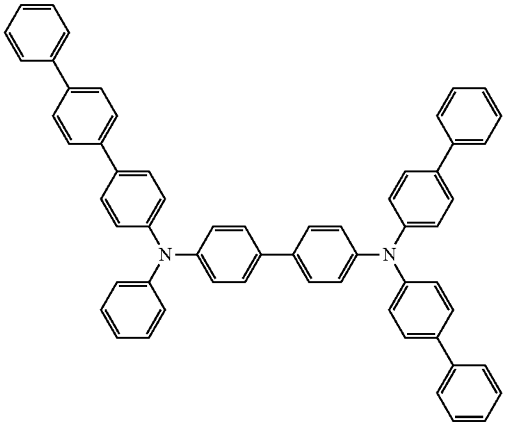

-continued

P4

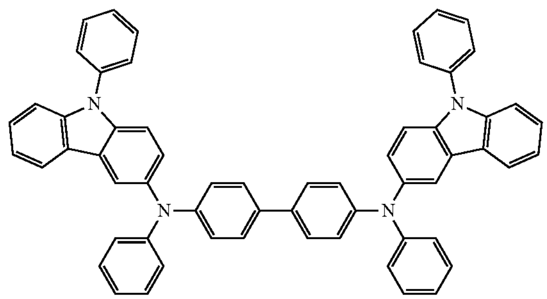

P5

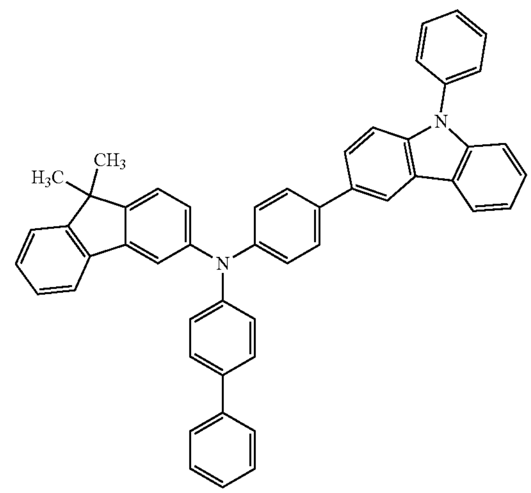

The capping layer CPL may have a refractive index of about 1.6 or greater. Specifically, the refractive index of the capping layer CPL may be about 1.6 or greater with respect to light having a wavelength range of about 550 nm to about 660 nm.

Hereinafter, characteristic evaluation results of a light emitting device according to an embodiment will be described with reference to Example and Comparative Examples. Example described below is one example for the convenience of understanding, and the scope is not limited thereto.

(Manufacture and Evaluation of Display Apparatus)

All of Example and Comparative Examples below were manufactured as display modules having the same structure as in FIG. 4 except for differences in p-type charge generation layer material and hole transport layer material. Example and Comparative Examples 1 and 2 each have a structure of a light emitting device as in FIG. 6A. Materials included in Example and Comparative Examples 1 and 2 are shown in Table 1 below.

TABLE 1

| | Classification | Material |
|---|---|---|
| Example | P-type charge generation layer (p-CGL1, p-CGL2) | First material |
| | Hole transport layer (MHTL1, MHTL2) | Second material |
| Comparative Example 1 | P-type charge generation layer (p-CGL1, p-CGL2) | First material |
| | Hole transport layer (MHTL1, MHTL2) | First material |

TABLE 1-continued

| | Classification | Material |
|---|---|---|
| Comparative Example 2 | P-type charge generation layer (p-CGL1, p-CGL2) | Second material |
| | Hole transport layer (MHTL1, MHTL2) | Second material |

Referring to Table 1, each of the first p-type charge generation layer p-CGL1 and the second p-type charge generation layer p-CGL2 in Example may include the first material, and each of the first intermediate hole transport layer MHTL1 and the second intermediate hole transport layer MHTL2 in Example may include the second material. In Comparative Example 1, the first p-type charge generation layer p-CGL1, the second p-type charge generation layer p-CGL2, the first intermediate hole transport layer MHTL1, and the second intermediate hole transport layer MHTL2 may each include the first material. In Comparative Example 2, the first p-type charge generation layer p-CGL1, the second p-type charge generation layer p-CGL2, the first intermediate hole transport layer MHTL1, and the second intermediate hole transport layer MHTL2 each include the second material.

Figure 7:
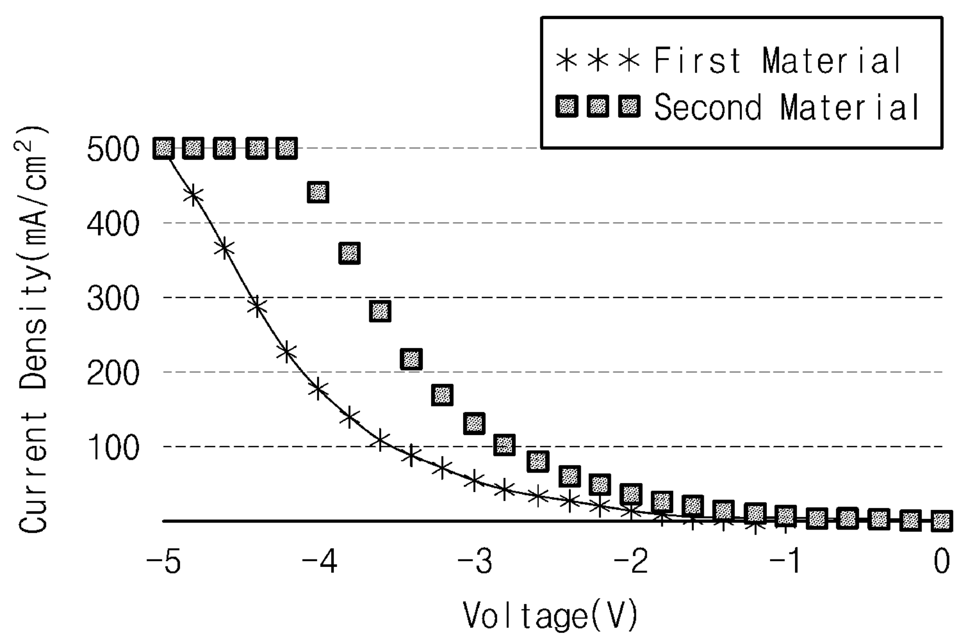
FIG. 7 is a schematic graph illustrating hole mobilities in materials included in Example and Comparative Examples.

FIG. 7 is a schematic graph illustrating hole mobilities in materials that may be included in Example and Comparative Examples. Specifically, FIG. 7 illustrates a hole mobility in the first material that may be included in Example and Comparative Example 1, and a hole mobility in the second material that may be included in Example and Comparative Example 2. In FIG. 7, a slope of a graph for the first material and a slope of a graph for the second material may be proportional to the hole mobility of the first material and the hole mobility of the second material, respectively. Referring to FIG. 7, the hole mobility of the first material may be smaller than the hole mobility of the second material. For example, the hole mobility of the first material included in the p-type charge generation layers p-CGL1, p-CGL2 and p-CGL3 in Example may be smaller than the hole mobility of the second material included in the hole transport layers MHTL1, MHTL2 and MHTL3 in Example.

Table 2 shows the evaluation results of Example and Comparative Examples. In the evaluation of the display modules in Table 2, the emission efficiency of white light was measured. The improvement degrees of the overall emission efficiency are indicated by percentage (%) on the basis of Comparative Example 1.

TABLE 2

| | Emission efficiency (%) |
|---|---|
| Comparative Example 1 | 100.0 |
| Comparative Example 2 | 100.0 |
| Example 1 | 102.8 |

Referring to the results in Table 2, it may be confirmed that the display module according to Example may have improved emission efficiency in case compared to the display modules according to Comparative Examples. In the light emitting device according to an embodiment, the material included in the p-type charge generation layer and the material included in the hole transport layer may be different from each other. Specifically, the hole mobility of the p-type charge generation layer may be smaller than the hole mobility of the hole transport layer. Accordingly, a recombination region in which electrons and holes in the light emitting layer are combined with each other to generate excitons may be close to the hole transport region so that a phenomenon in which singlet excitons are generated by collision of triplet excitons (triplet-triplet annihilation, TTA) may increase. Accordingly, the emission efficiency of the display module according to Example may increase as described above. Therefore, the display apparatus according to an embodiment may achieve the high emission efficiency while maintaining the long lifetime.

According to an embodiment, the charge balance of the light emitting layer may be improved in the light emitting device to provide the light emitting device and the display apparatus with the improved emission efficiency.

Although the embodiments of the disclosure have been described, it is understood that the disclosure should not be limited to these embodiments but various changes and modifications can be made by one ordinary skilled in the art within the spirit and scope of the disclosure. Therefore, the technical scope of the disclosure is not limited to the contents described in the detailed description of the specification.

What is claimed is:

1. A light emitting device comprising:

a first electrode;

a first light emitting stack disposed on the first electrode, the first light emitting stack comprising a first hole transport layer;

a charge generation layer disposed on the first light emitting stack, the charge generation layer comprising a p-type charge generation layer;

a second light emitting stack disposed on the charge generation layer, the second light emitting stack comprising a second hole transport layer; and a second electrode disposed on the second light emitting stack, wherein, a hole mobility of the p-type charge generation layer is lower than a hole mobility of the first hole transport layer and a hole mobility of the second hole transport layer, and the p-type charge generation layer includes a highest occupied molecular orbital (HOMO) energy level that is equal to or lower than a HOMO energy level of the second hole transport layer.

2. The light emitting device of claim 1, wherein a material included in the hole transport layer is different from a material included in the charge generation layer.

3. The light emitting device of claim 1, wherein the hole mobility of the charge generation layer is in a range of about 50% to about 80% of the hole mobility of the hole transport layer.

4. The light emitting device of claim 1, wherein:

the charge generation layer comprises:

an n-type charge generation layer doped with an n-dopant; and a p-type charge generation layer doped with a p-dopant, and a hole mobility of the p-type charge generation layer is lower than the hole mobility of the hole transport layer.

5. The light emitting device of claim 4, wherein:

the p-type charge generation layer includes a thickness in a range of about 10 Å to about 100 Å; and the hole transport layer includes a thickness in a range of about 100 Å to about 700 Å.

6. The light emitting device of claim 1, wherein the hole mobility of the charge generation layer is lower than a hole mobility of the second hole transport layer.

7. The light emitting device of claim 1, wherein the second hole transport layer is disposed directly on the charge generation layer.

8. The light emitting device of claim 1, wherein:
the first light emitting stack comprises a first light emitting layer disposed on the first hole transport layer; and
the second light emitting stack comprises a second light emitting layer disposed on the second hole transport layer.

9. The light emitting device of claim 8, wherein:
The first light emitting layer emits light having a first wavelength, and
the first wavelength is in a range of about 410 nm to about 480 nm.

10. The light emitting device of claim 8, wherein:
the second light emitting layer emits light having a first wavelength or a second wavelength,
the first wavelength is in a range of about 410 nm to about 480 nm, and
the second wavelength is in a range of about 500 nm to about 600 nm.

11. The light emitting device of claim 1, wherein:
the charge generation layer comprises:
an n-type charge generation layer disposed on the first light emitting stack; and
the p-type charge generation layer disposed on the n-type charge generation layer.

12. The light emitting device of claim 11, wherein a hole mobility of the p-type charge generation layer is lower than a hole mobility of the second hole transport layer.

13. The light emitting device of claim 11, wherein the second hole transport layer is disposed directly on the p-type charge generation layer.

14. The light emitting device of claim 11, wherein the HOMO energy level of each of the p-type charge generation layer and the second hole transport layer is in a range of about −5.3 eV to about −5.1 eV.

15. A display apparatus comprising:
a base layer including:
a first pixel region emitting light having a first wavelength;
a second pixel region emitting light having a second wavelength different from the first wavelength; and
a third pixel region emitting light having a third wavelength different from the first wavelength and the second wavelength;
a light emitting device overlapping the first to third pixel regions and disposed on the base layer; and
a light control layer disposed on the light emitting device and including:
a first light control unit overlapping the first pixel region;
a second light control unit overlapping the second pixel region; and
a third light control unit overlapping the third pixel region,
wherein the light emitting device comprises:
a first electrode,
a first light emitting stack disposed on the first electrode, the first light emitting stack comprising a first hole transport layer,
a charge generation layer disposed on the first light emitting stack, the charge generation layer comprising a p-type charge generation layer,
a second light emitting stack disposed on the charge generation layer, the second light emitting stack comprising a second hole transport layer, and
a second electrode disposed on the second light emitting stack,
each of the first light emitting stack and the second light emitting stack includes a hole transport layer, and
a hole mobility of the p-type charge generation layer is lower than a hole mobility of the first hole transport layer and a hole mobility of the second hole transport layer, and
the p-type charge generation layer includes a highest occupied molecular orbital (HOMO) energy level that is equal to or lower than a HOMO energy level of the second hole transport layer.

16. The display apparatus of claim 15, wherein:
the second light control unit comprises a quantum dot that converts the light having the first wavelength into the light having the second wavelength; and
the third light control unit comprises a quantum dot that converts the light having the first wavelength or the light having the second wavelength into the light having the third wavelength.

17. The display apparatus of claim 15, further comprising a color filter layer disposed on the light control layer.

18. The display apparatus of claim 15, wherein:
the first electrode is a reflective electrode;
the second electrode is a transflective electrode or a transmissive electrode; and the light having the first wavelength is emitted in a direction from the first electrode to the second electrode.

* * * * *